(12) United States Patent
Hsiao et al.

(10) Patent No.: US 12,107,041 B2
(45) Date of Patent: *Oct. 1, 2024

(54) METAL PLATE CORNER STRUCTURE ON METAL INSULATOR METAL

(71) Applicant: Taiwan Semiconductor Manufacturing Co., Ltd., Hsin-Chu (TW)

(72) Inventors: Yuan-Yang Hsiao, Taipei (TW); Hsiang-Ku Shen, Taiwan (TW); Dian-Hau Chen, Hsinchu (TW); Hsiao Ching-Wen, Hsinchu (TW); Yao-Chun Chuang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/359,011

(22) Filed: Jul. 26, 2023

(65) Prior Publication Data

US 2023/0369199 A1    Nov. 16, 2023

Related U.S. Application Data

(63) Continuation of application No. 17/470,680, filed on Sep. 9, 2021, now Pat. No. 11,728,262.

(Continued)

(51) Int. Cl.
*H01L 23/522* (2006.01)
*H01L 21/768* (2006.01)
(Continued)

(52) U.S. Cl.
CPC .... *H01L 23/5223* (2013.01); *H01L 21/76843* (2013.01); *H01L 23/528* (2013.01);
(Continued)

(58) Field of Classification Search
CPC ........... H01L 23/5223; H01L 21/76843; H01L 23/528; H01L 28/40; H01L 28/91;
(Continued)

(56) References Cited

U.S. PATENT DOCUMENTS 6,934,143 B2    8/2005    Chou
7,195,970 B2    3/2007    Tu
(Continued)

FOREIGN PATENT DOCUMENTS

WO    2017185326 A1    11/2017

*Primary Examiner* — Patricia D Valenzuela
(74) *Attorney, Agent, or Firm* — HAYNES AND BOONE, LLP

(57) ABSTRACT

A metal-insulator-metal (MIM) structure and methods of forming the same for reducing the accumulation of external stress at the corners of the conductor layers are disclosed herein. An exemplary device includes a substrate that includes an active semiconductor device. A stack of dielectric layers is disposed over the substrate. A lower contact is disposed over the stack of dielectric layers. A passivation layer is disposed over the lower contact. A MIM structure is disposed over the passivation layer, the MIM structure including a first conductor layer, a second conductor layer disposed over the first conductor layer, and a third conductor layer disposed over the second conductor layer. A first insulator layer is disposed between the first conductor layer and the second conductor layer. A second insulator layer is disposed between the second conductor layer and the third conductor layer. One or more corners of the third conductor layer are rounded.

20 Claims, 26 Drawing Sheets

Related U.S. Application Data

(60) Provisional application No. 63/157,152, filed on Mar. 5, 2021.

(51) Int. Cl.
  H01L 23/528 (2006.01)
  H01L 49/02 (2006.01)
  H10B 12/00 (2023.01)

(52) U.S. Cl.
  CPC .............. H01L 28/40 (2013.01); H01L 28/75 (2013.01); H01L 28/84 (2013.01); H01L 28/91 (2013.01); H10B 12/033 (2023.02)

(58) Field of Classification Search
  CPC ........... H01L 21/76805; H01L 23/5226; H01L 28/75; H01L 28/84; H10B 12/033
  See application file for complete search history.

(56) References Cited

U.S. PATENT DOCUMENTS

| | | |
|---|---|---|
| 7,557,399 B2 | 7/2009 | Tu |
| 9,269,761 B2 | 2/2016 | Pan |
| 9,287,350 B2 | 3/2016 | Yang |
| 9,941,195 B2 | 4/2018 | Liao |
| 10,553,672 B2 | 2/2020 | Huang |
| 11,728,262 B2 * | 8/2023 | Hsiao ................. H01L 28/40 257/532 |
| 2009/0160020 A1 | 6/2009 | Barth |
| 2010/0219502 A1 * | 9/2010 | Shieh ................. H01L 28/40 257/532 |
| 2012/0161215 A1 * | 6/2012 | Lindert ................. H01L 28/91 257/532 |
| 2016/0197082 A1 | 7/2016 | Park |
| 2018/0277624 A1 | 9/2018 | Schultz |
| 2019/0172826 A1 | 6/2019 | Or-Bach |
| 2022/0285264 A1 | 9/2022 | Hsiao |

* cited by examiner

US 12,107,041 B2

METAL PLATE CORNER STRUCTURE ON METAL INSULATOR METAL

PRIORITY DATA

The present application is a continuation application of U.S. patent application Ser. No. 17/470,680, filed on Sep. 9, 2021, which claims the benefit of U.S. Provisional Patent Application Ser. No. 63/157,152, filed on Mar. 5, 2021, each of which is incorporated herein by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

By way of example, and with the continued scaling of IC devices, passive devices requiring large surface areas may be fabricated as part of a back-end-of-line (BEOL) process. One example of a passive device that may be formed as part of a BEOL process is a metal-insulator-metal (MIM) capacitor. In general, a MIM capacitor includes multiple conductor plate layers that are separated from one another by dielectric layers. In some examples, MIM capacitors may be formed over a semiconductor substrate including a device layer (e.g., transistors, etc.) and a multi-layer interconnect (MLI) structure which provides interconnections between various microelectronic components within the substrate. In some embodiments, a passivation layer may be formed over the MIM capacitors, and contact vias may be formed to electrically couple lower contact features to upper contact features, such as contact pads, for connection to external circuitry. The contact pads may also be disposed in regions above the MIM capacitors. As the size of MIM capacitors is scaled down, the MIM capacitors become susceptible to cracking. A need thus exists for improvements in the MIM capacitors and/or methods of fabricating the MIM capacitors.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
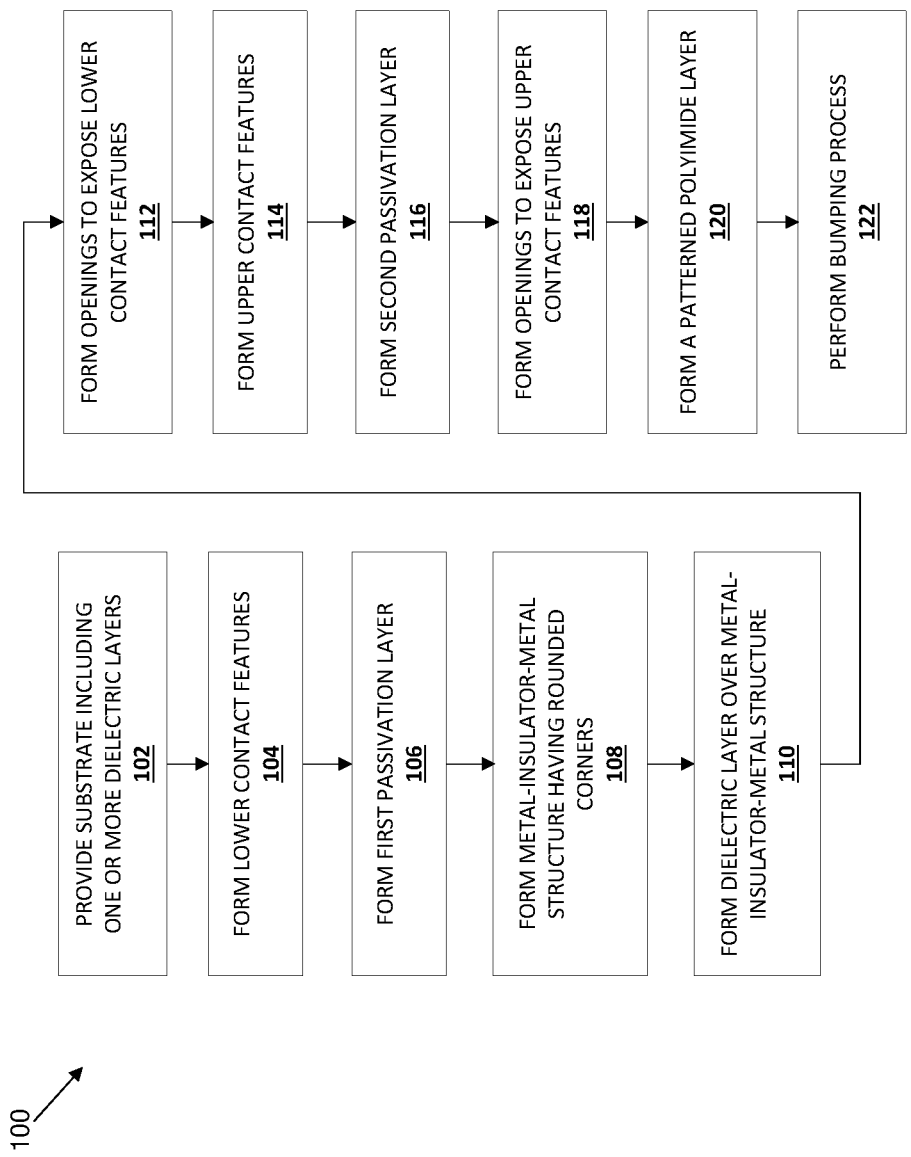
FIG. 1 is a flow chart of a method for fabricating a metal-insulator-metal device according to various aspects of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

Metal-insulator-metal (MIM) capacitors have been widely used in functional circuits such as mixed signal circuits, analog circuits, radio frequency (RF) circuits, dynamic random-access memories (DRAMs), embedded DRAMs, and logic operation circuits. In system-on-chip (SOC) applications, different capacitors for different functional circuits are integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, a MIM capacitor includes a sandwich structure of interleaving metal layers and insulator layers. An exemplary MIM capacitor includes a bottom conductor plate layer, a middle conductor plate layer over the bottom conductor plate layer, and a top conductor plate layer over the middle conductor plate layer, each of which is insulated from an adjacent conductor plate layer by a dielectric layer.

In various embodiments, MIM capacitors may be fabricated as part of a back-end-of-line (BEOL) process. In some examples, MIM capacitors may be formed over a semiconductor substrate including a device layer (e.g., transistors, etc.) and a multi-layer interconnect (MLI) structure, which provides interconnections between various microelectronic components within the substrate. In some embodiments, a passivation layer may be formed over the MIM capacitors, and contact vias may be formed to electrically couple lower contact features to upper contact features, such as contact pads, for connection to external circuitry. The contact pads may also be disposed in regions above (or near) the MIM capacitors. In some cases, stress may be induced on the MIM capacitors by surrounding layers and/or features (e.g., such as the passivation layer and the contact pads). As a result, the MIM capacitors may be damaged. In some examples, the induced stress may also form cracks which can propagate to the MIM capacitors, degrading their performance. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for releasing stress that would otherwise be induced on MIM capacitors and for preventing stress-induced damage to MIM capacitors. In some embodiments, a conductor plate layer that is part of a MIM capacitor may be formed having square corners. The square corners of the conductor plate layer may be rounded through various processes such as photolithography, developing, and/or etching the conductor plate layer. In some other embodiments, the conductor plate layer may be formed having rounded corners through various deposition, photolithography, developing, and/or etching processes. In some embodiments, a bottom conductor plate layer and a top conductor plate layer are formed having round corners and a middle conductor plate layer is formed having square corners. In some embodiments, the corners are rounded both vertically and horizontally. In some embodiments, the rounded corners may prevent the formation of cracks and/or defects in the MIM capacitor and/or the surrounding area. Additional details of embodiments of the present disclosure are provided below, and additional benefits and/or other advantages will become apparent to those skilled in the art having benefit of the present disclosure.

FIG. 1 is a flow chart of a method 100 for forming a metal-insulator-metal device having smooth corners according to some embodiments of the present disclosure. At block 102, form a semiconductor layer stack over a substrate including one or more dielectric layers. At block 104, form lower contact features in the dielectric layers including diffusion barrier layer and metal seed layer. At block 106, form a first passivation layer over the lower contact features. At block 108, form a metal-insulator-metal structure including two or more conductive plate layers and a dielectric layer between each conductive plate layer. One or more of the conductive plate layers may be formed having rounded corners. Alternatively, additional processing may be performed to round the corners of one or more of the conductor plate layers after forming the conductor plate layer. At block 110 form a dielectric layer over the metal-insulator-metal structure. At block 112, form openings to expose lower contact features. At block 114, form upper contact features that contact the lower contact features in the openings. At block 118, form second passivation layer over the upper contact features. At block 120, form openings in the second passivation layer to expose upper contact features. At block 122, form a patterned polyimide layer. At block 124, perform a bumping process.

Figure 2A:
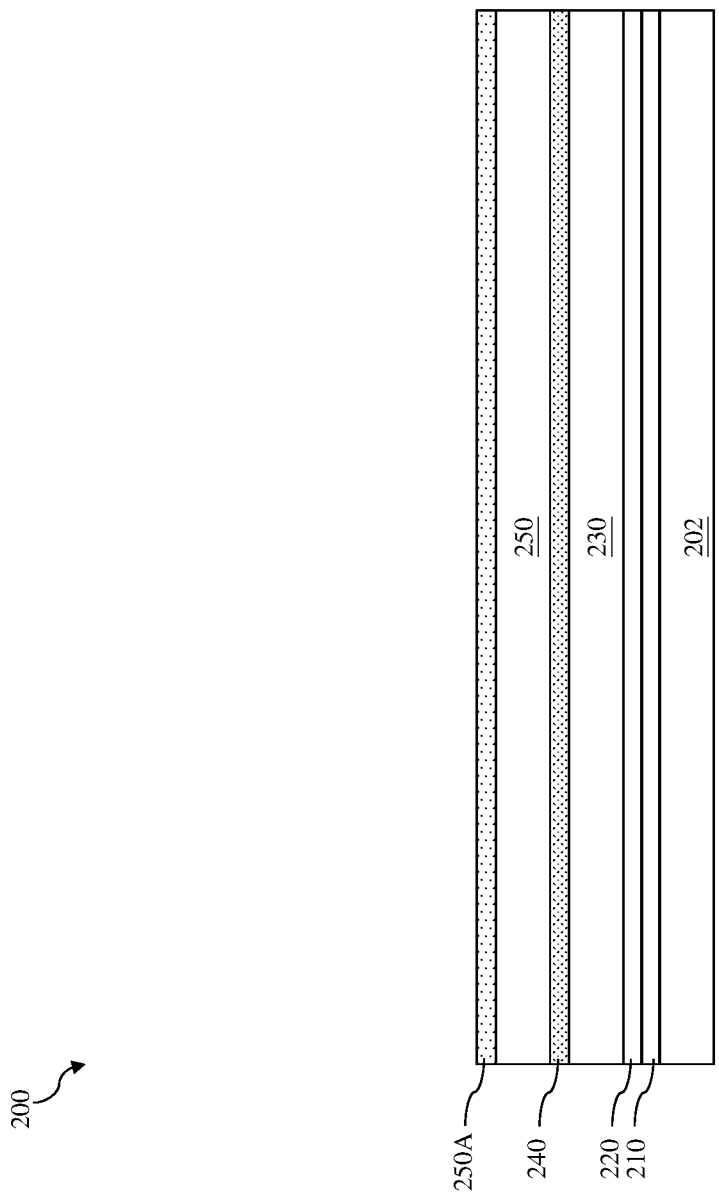
FIGS. 2A-2P are diagrammatic cross-sectional views of a metal-insulator-metal device at various fabrication stages (such as those associated with the method in FIG. 1 and/or FIG. 5) according to various aspects of the present disclosure.
Figure 2B:
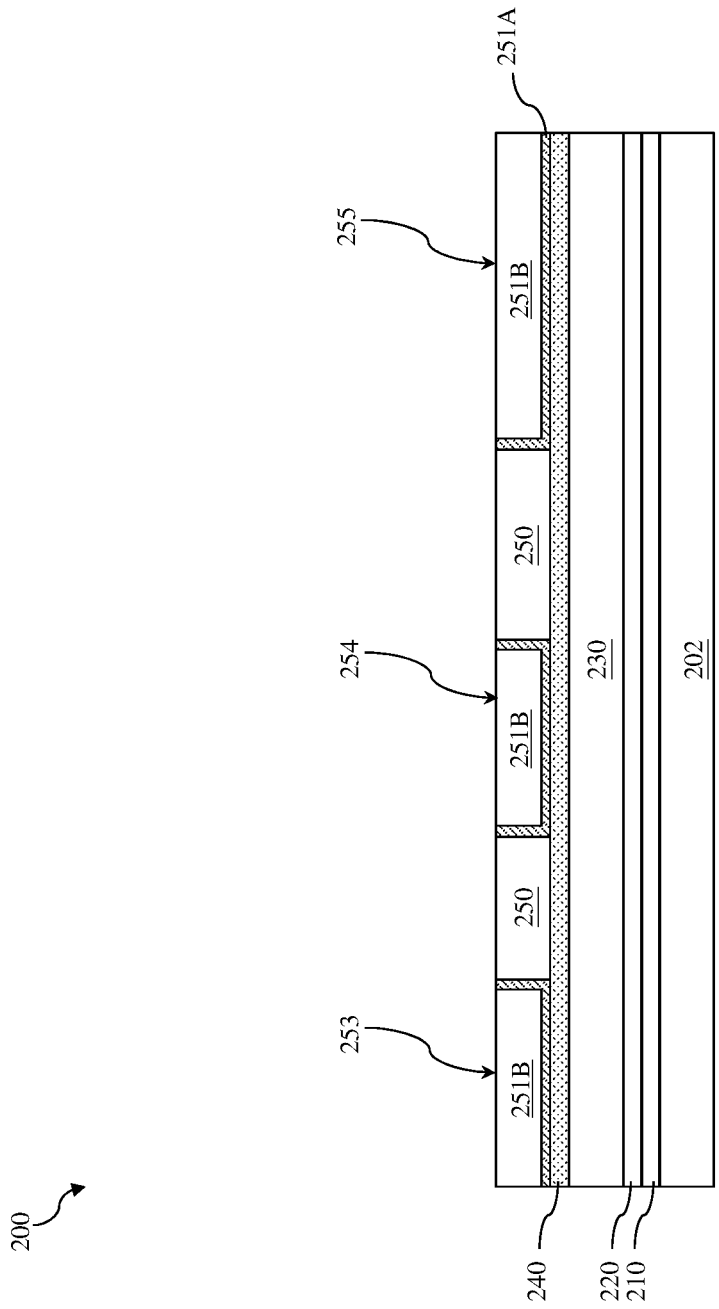
Figure 2C:
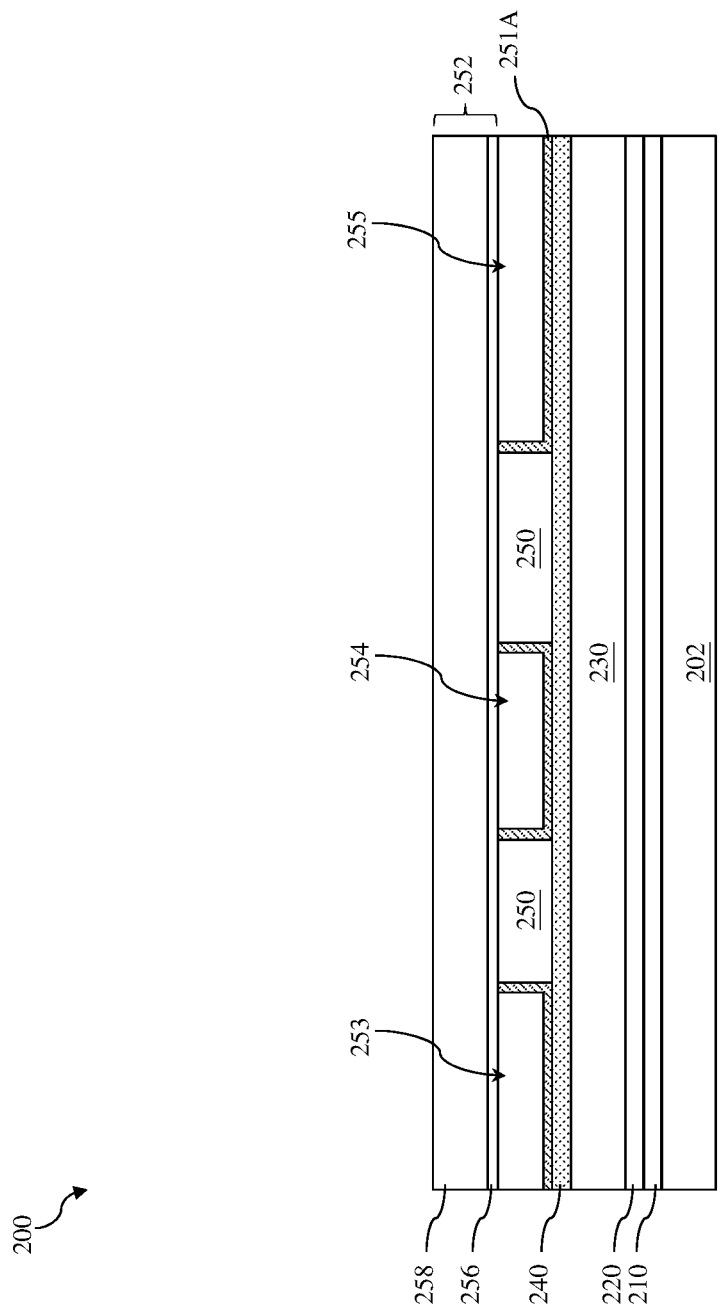
Figure 2D:
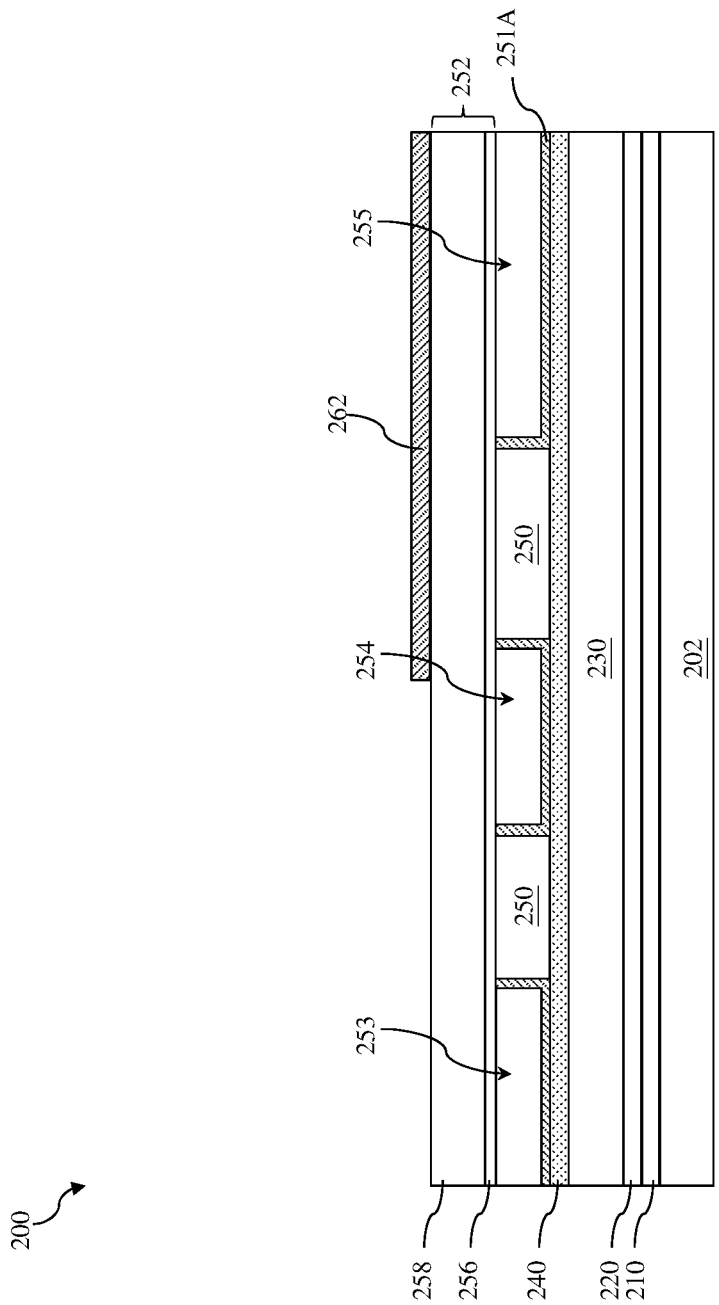
Figure 2E:
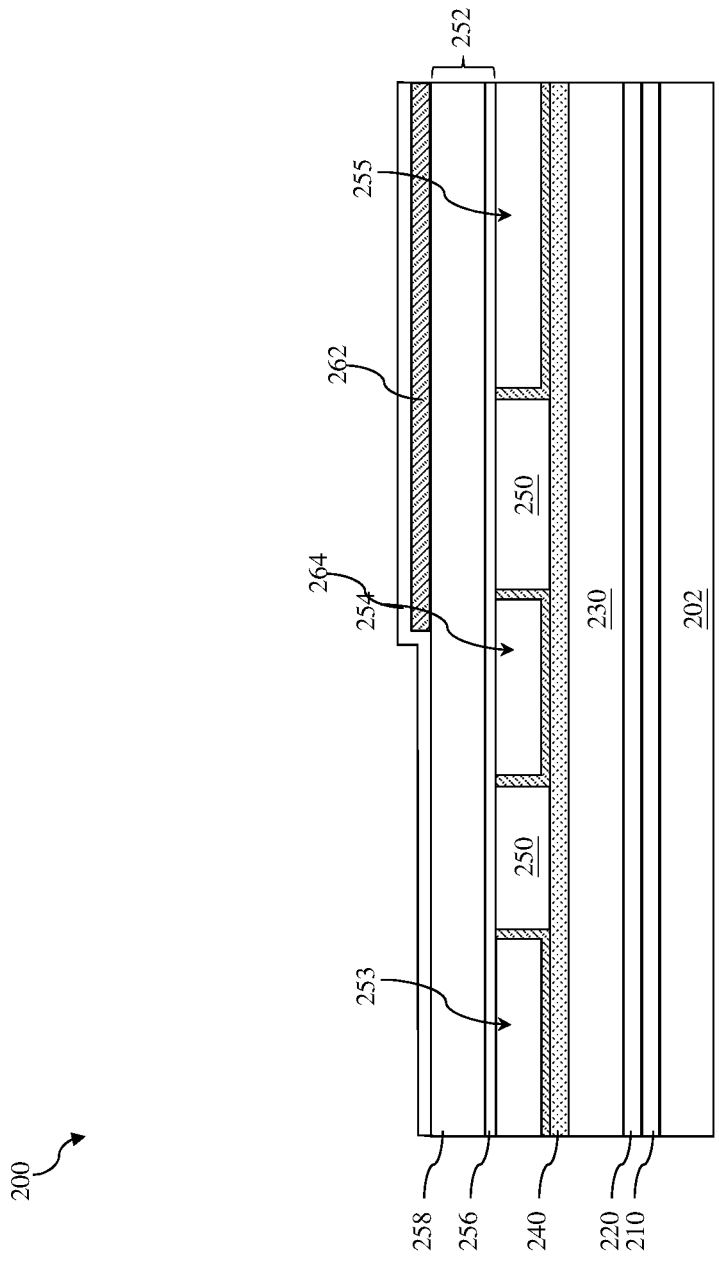
Figure 2F:
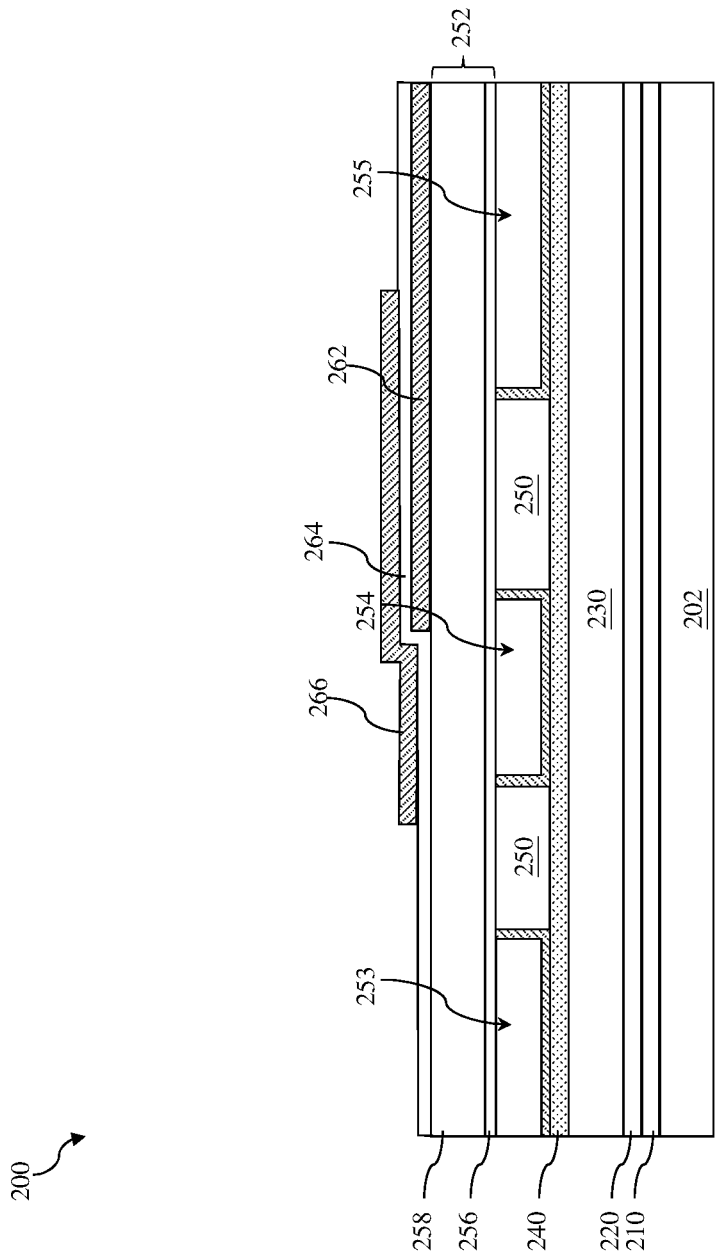
Figure 2G:
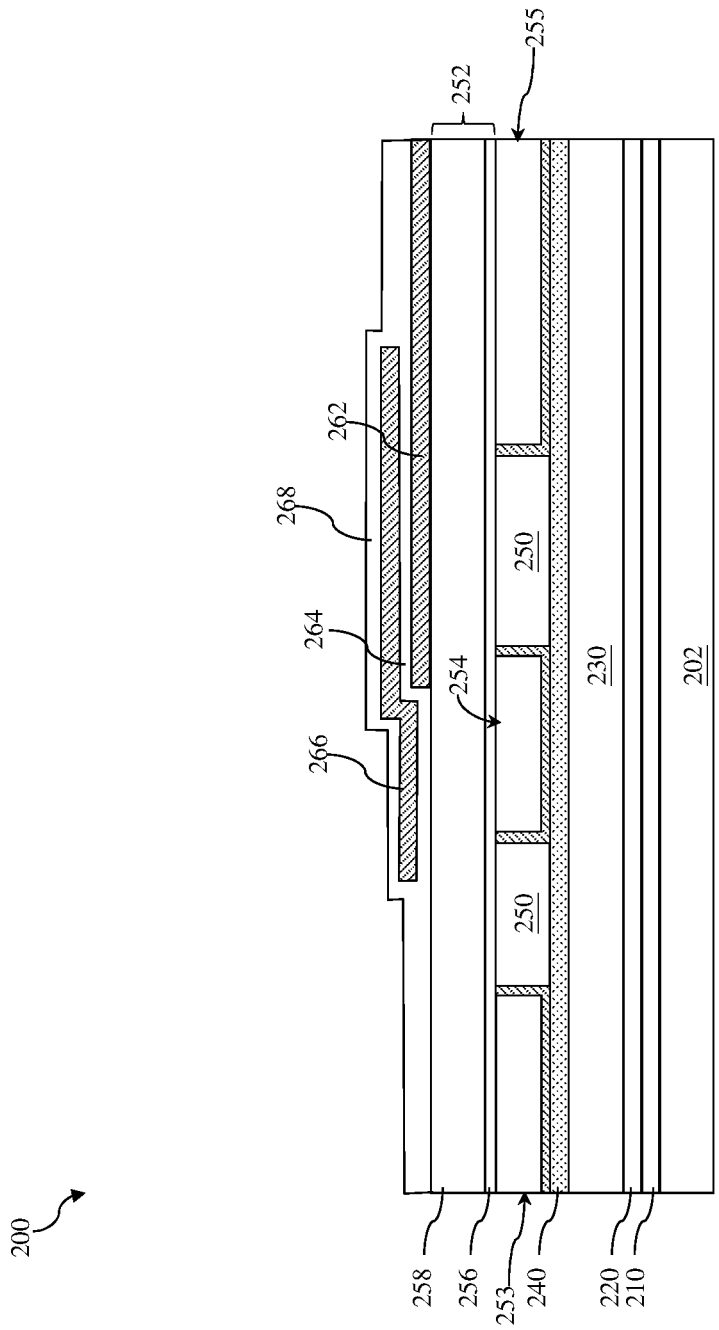
Figure 2H:
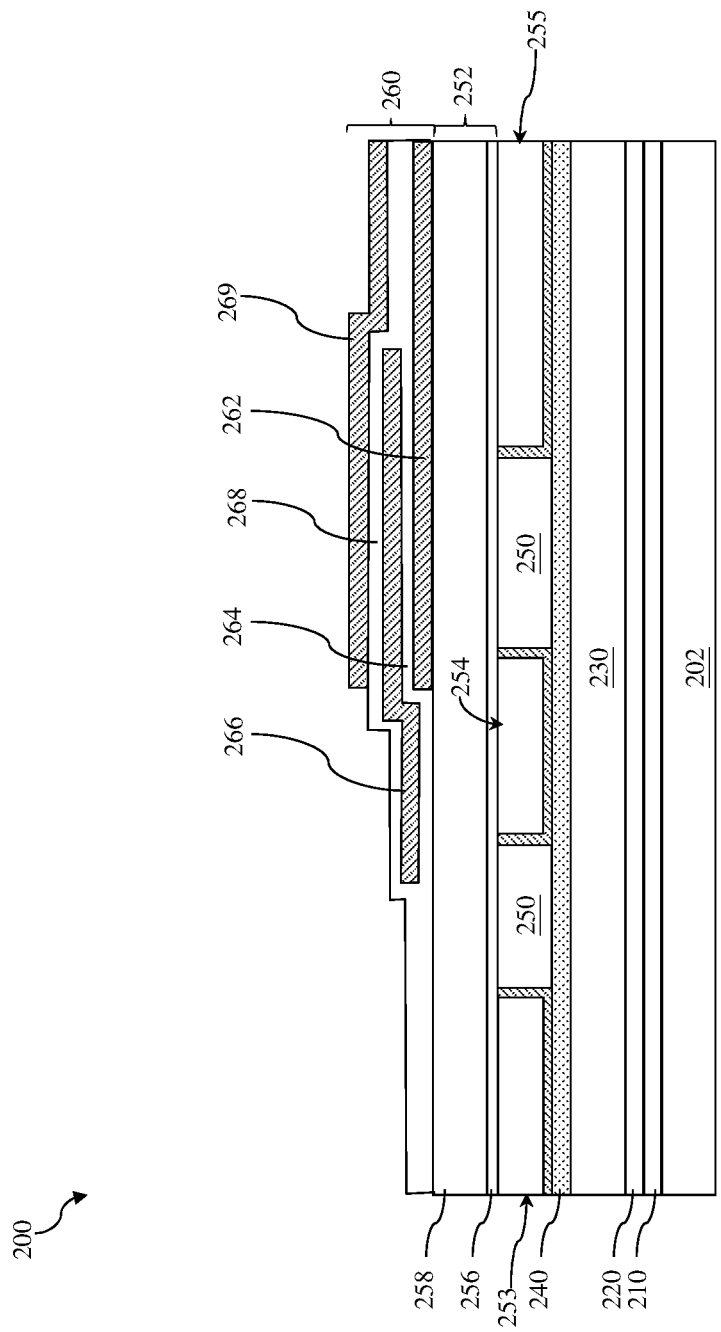
Figure 2I:
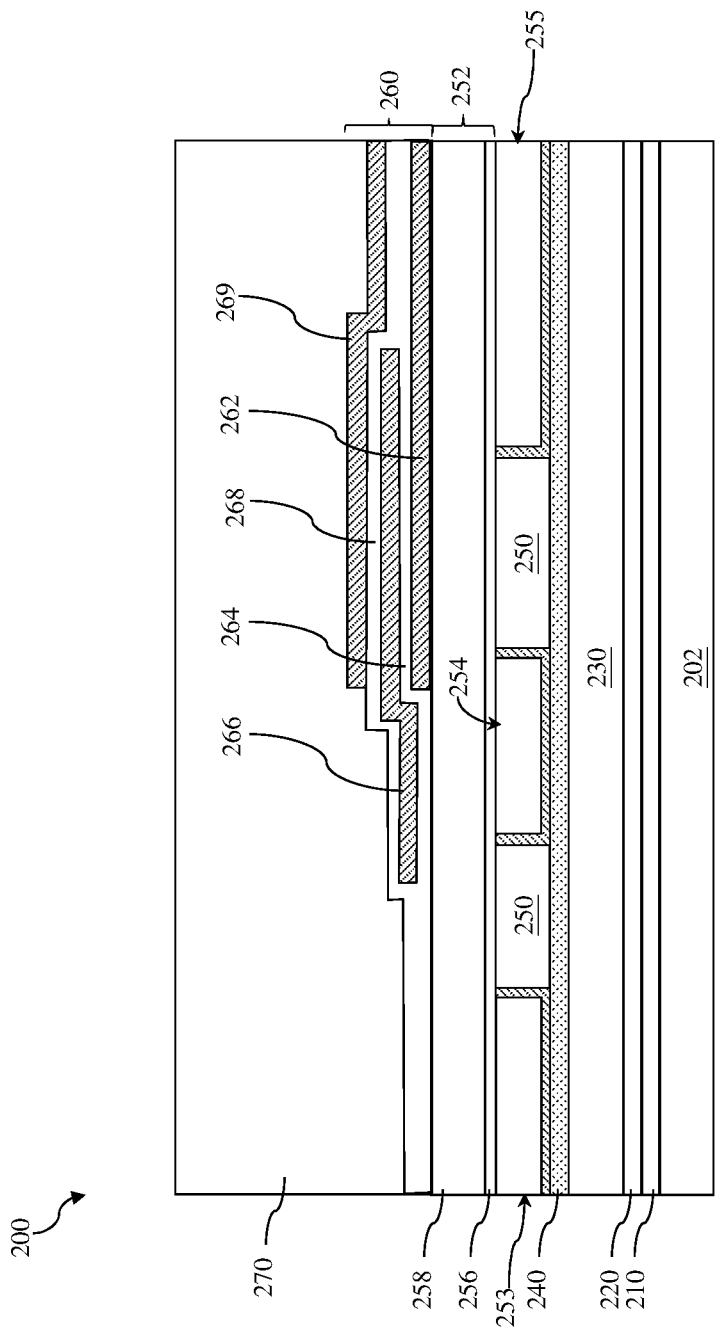
Figure 2J:
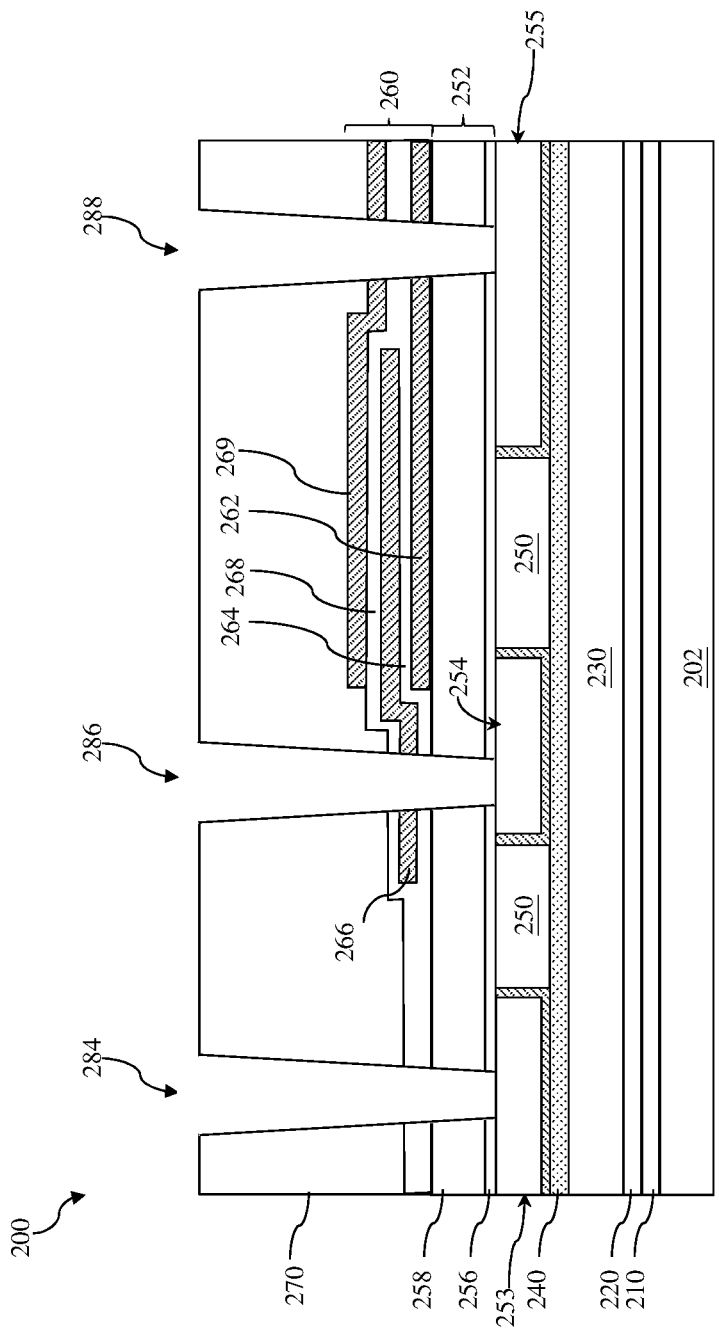
Figure 2K:
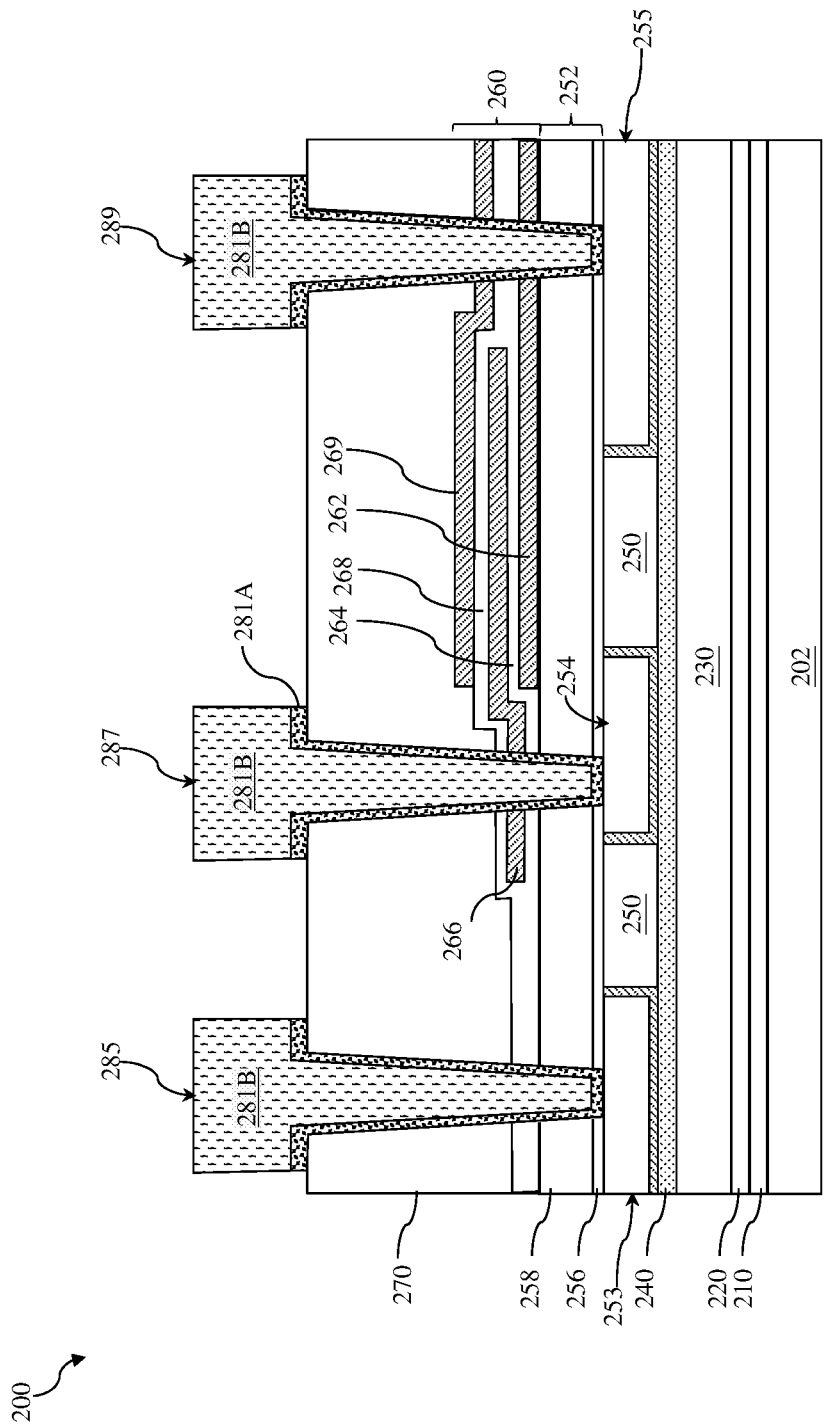
Figure 2L:
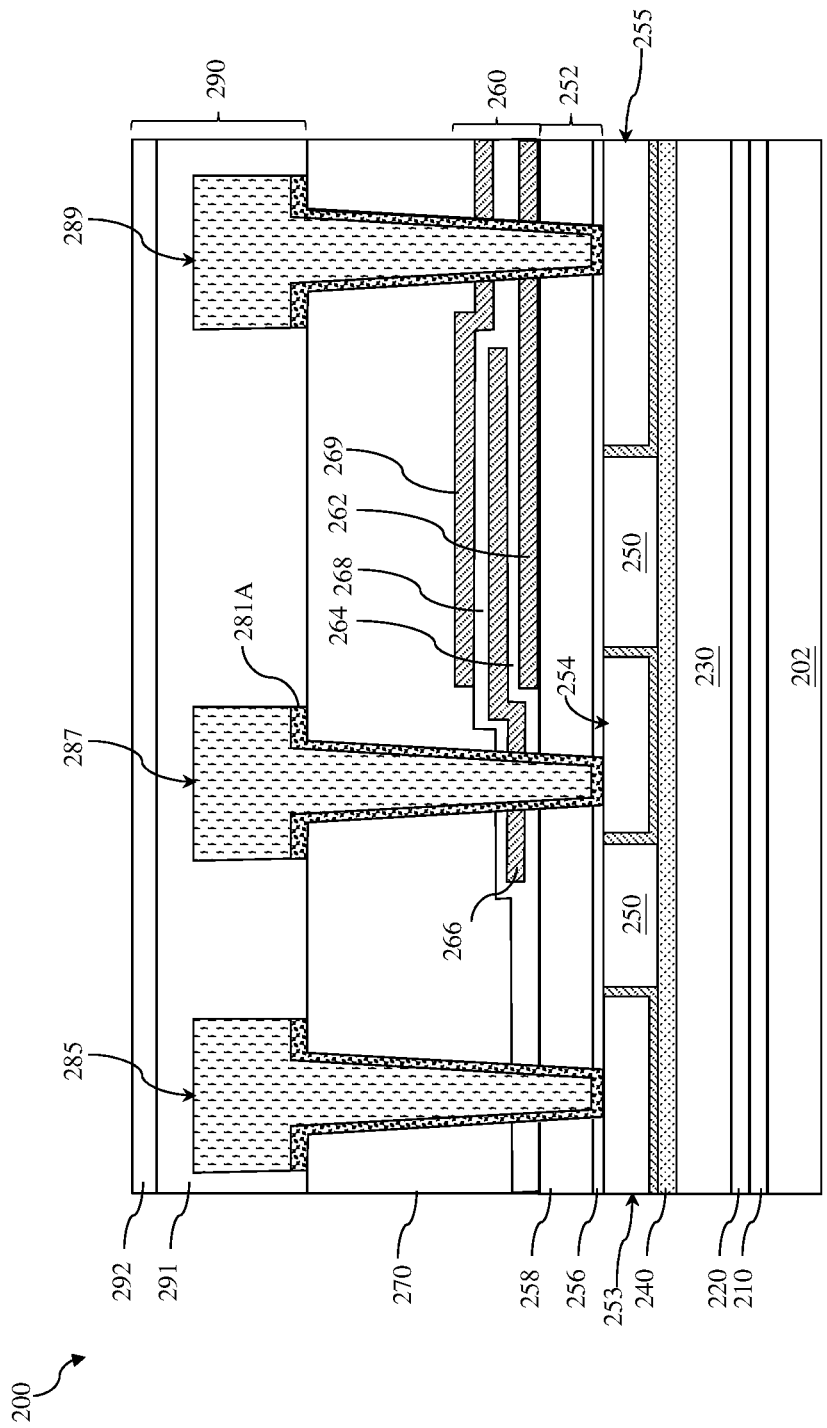
Figure 2M:
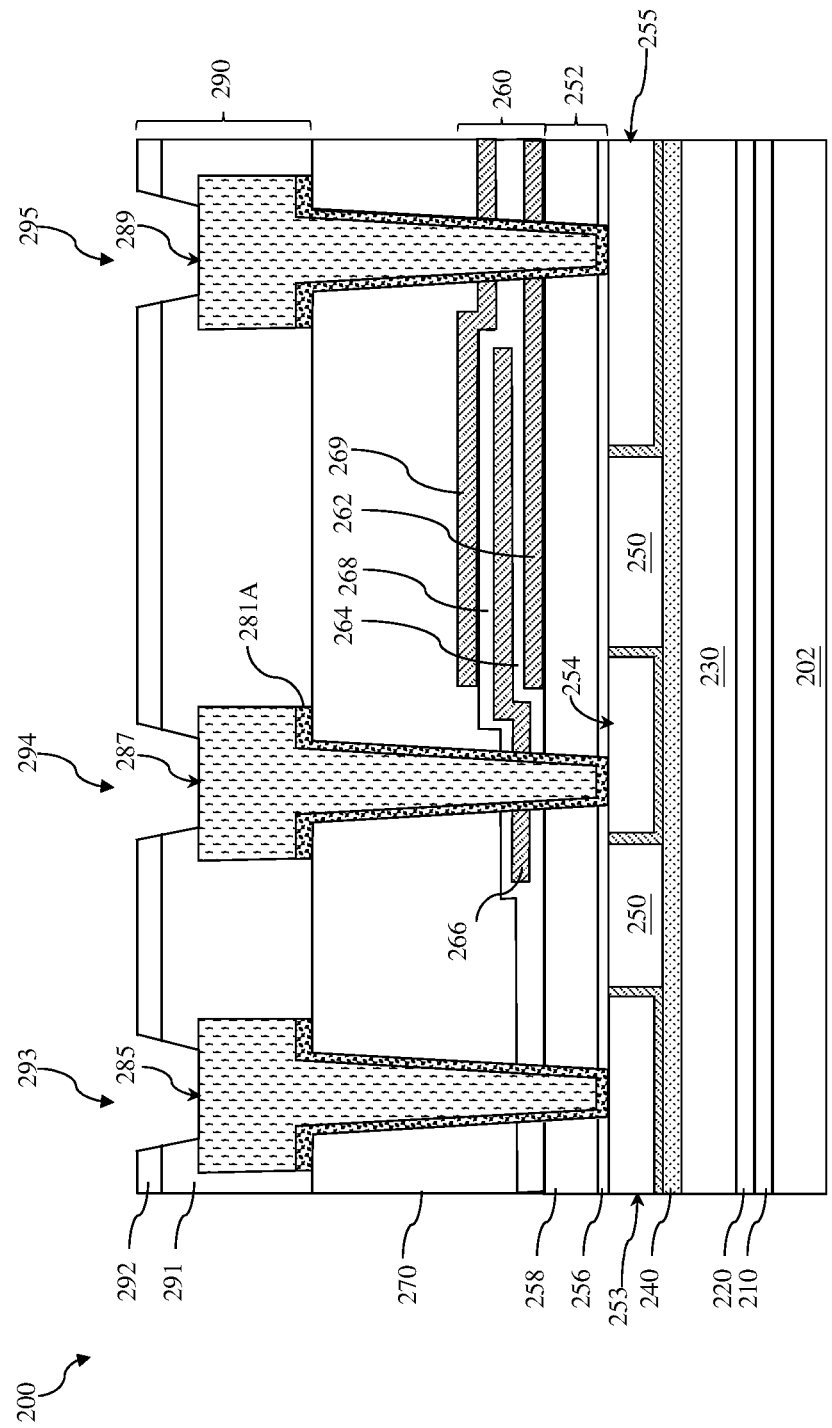
Figure 2N:
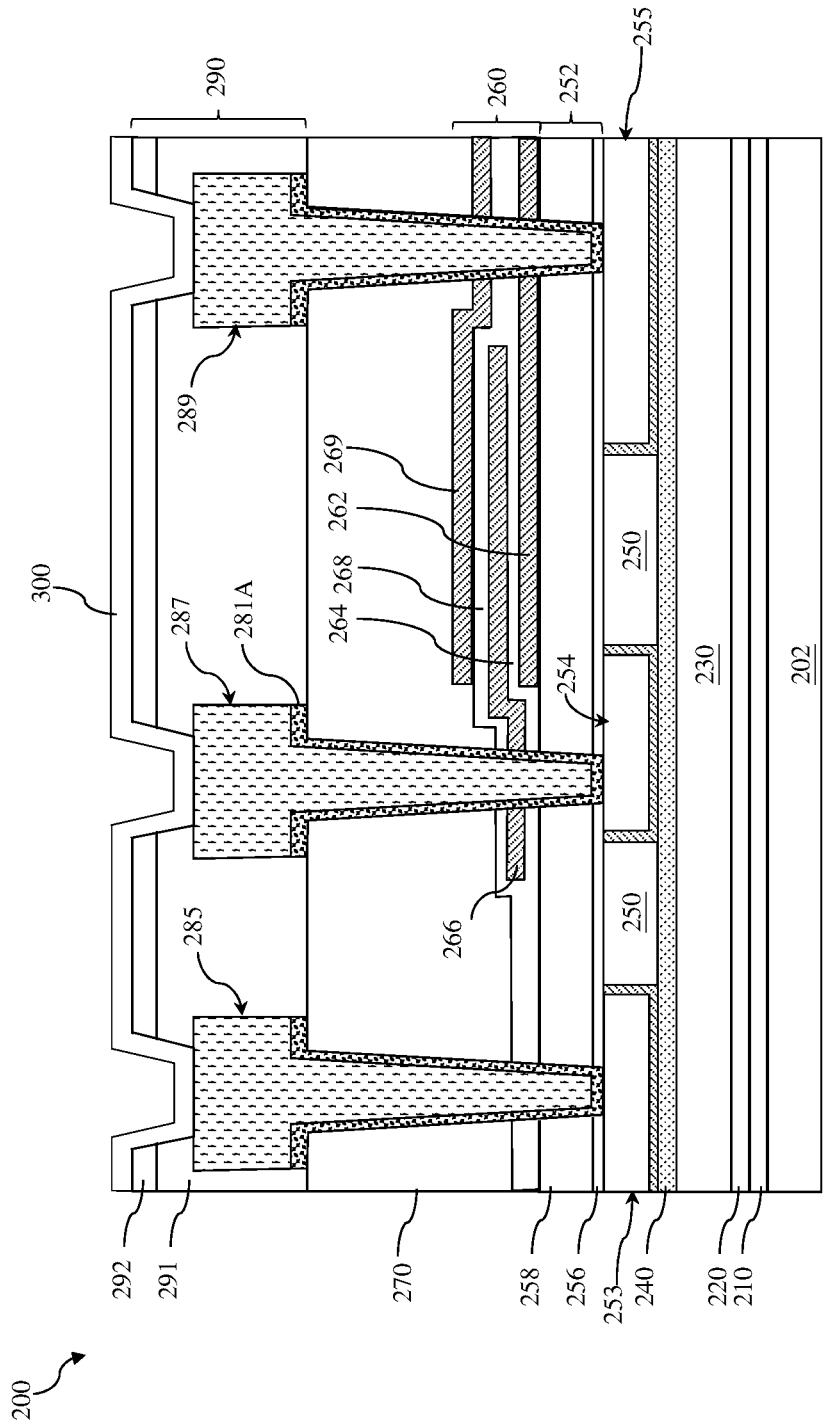
Figure 2O:
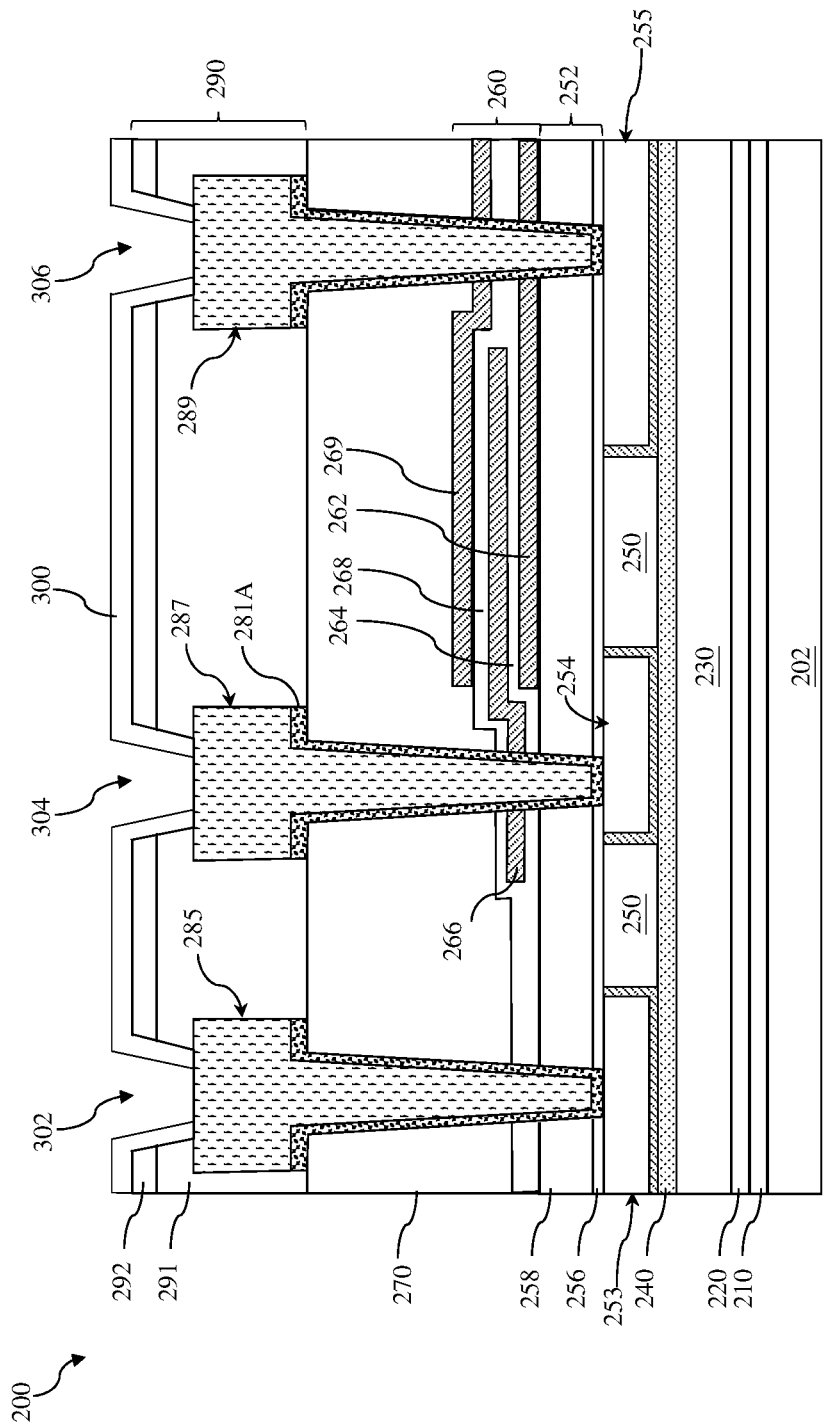
Figure 2P:
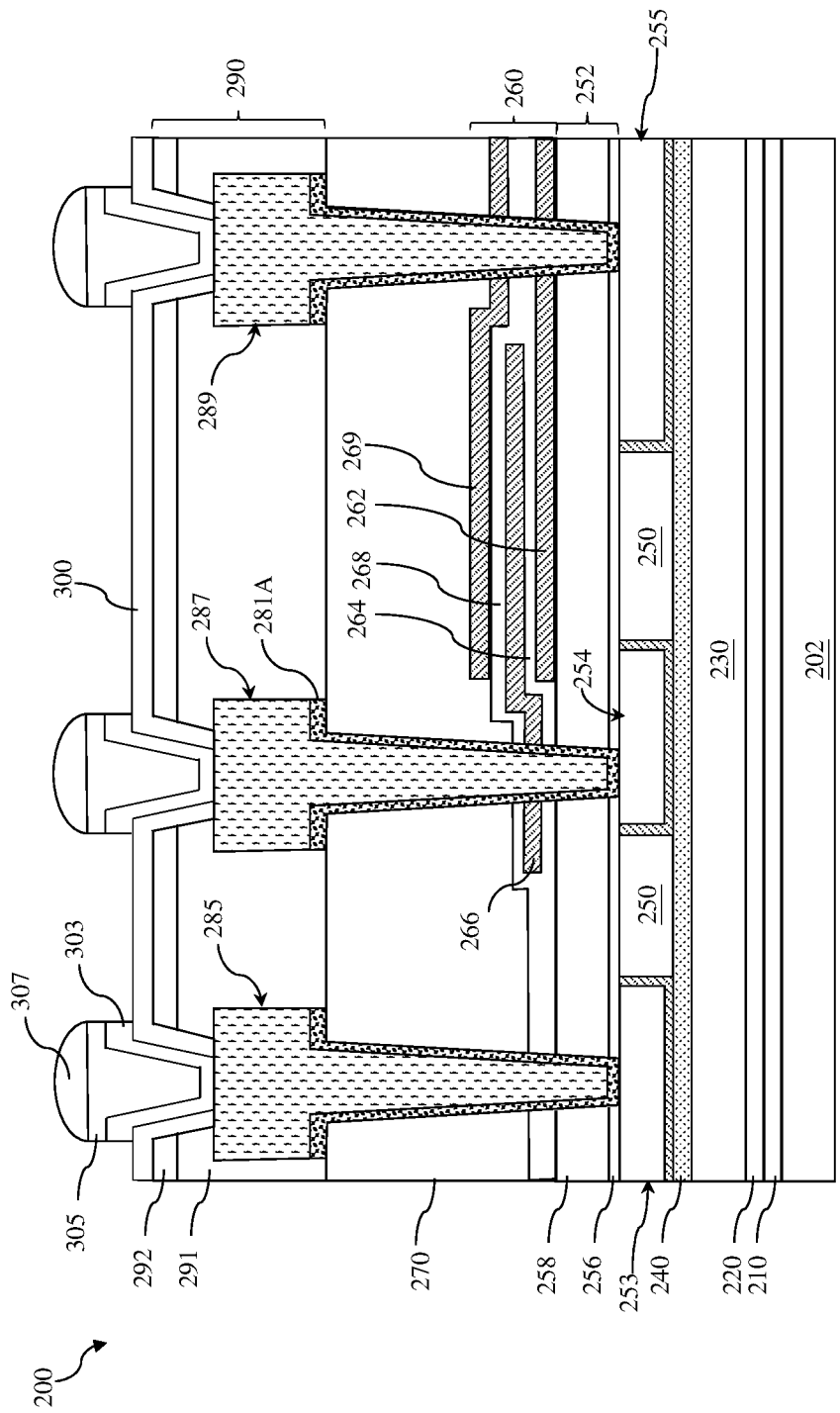

FIGS. 2A-2P are diagrammatic cross-sectional views of a metal-insulator-metal (MIM) device 200 at various stages of fabrication (such as those associated with method 100 of FIG. 1) according to various aspects of the present disclosure. FIGS. 2A-2P have been simplified for the sake of clarity to better understand the inventive concepts of the present disclosure. Additional features can be added in MIM device 200, and some of the features described below can be replaced, modified, or eliminated in other embodiments of MIM device 200.

Turning to FIG. 2A, MIM device 200 includes a substrate (wafer) 202. The substrate 202 may be a semiconductor substrate, such as a silicon substrate. The substrate 202 may include various layers, including conductive or insulating layers formed on the substrate 202. The substrate 202 may include various doping configurations depending on design requirements as is known in the art. The substrate 202 may also include other semiconductors, such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

In some embodiments, the substrate 202 includes one or more active and/or passive semiconductor devices such as transistors, diodes, optoelectronic devices, resistors, capacitors, sensors, or other devices. In various examples, the transistors may include source/drain features, gate structures, gate spacers, contact features, isolation structures, such as shallow trench isolation (STI) structures, or other suitable components. By way of example, the active and/or passive semiconductor devices formed within the substrate 202 may be formed as part of a front-end-of-line (FEOL) process.

In various examples, the substrate 202 may also include an interconnect structure, such as a multi-layer interconnect (MLI) structure, which may include multiple patterned dielectric layers and conductive layers that provide interconnections (e.g., wiring) between the various microelectronic components formed within the substrate 202. By way of example, the MLI structure, as well as other layers, features, components, or devices formed over the MLI structure may be formed as part of a BEOL process. In addition, and in at least some cases, one or more of the dielectric layers and/or conductive layers of the MLI structure may be formed over the substrate 202. As noted, the interconnect structure may include a plurality of conductive features and a plurality of dielectric features used to provide isolation between the conductive features. In some embodiments, the conductive features may include contacts, vias, or metal lines to provide horizontal and vertical interconnections. In some cases, the metal lines may include copper (Cu), aluminum (Al), aluminum copper (AlCu) alloy, ruthenium (Ru), cobalt (Co), or other appropriate metal layer. In some examples, the contacts and/or vias may include Cu, Al, AlCu alloy, Ru, Co, tungsten (W), or other appropriate metal layer. In some embodiments, the dielectric features of the MLI structure may include silicon oxide or a silicon oxide containing material where silicon exists in various suitable forms. In some examples, the dielectric features may include a low-K dielectric layer (e.g., having a dielectric constant less than that of $SiO_2$, which is about 3.9) such as tetraethylorthosilicate (TEOS) oxide, undoped silicate glass (USG), doped silicon oxide, such as borophosphosilicate glass (BPSG), fluorosilicate glass (FSG), phosphosilicate glass (PSG), boron doped silicon glass (BSG), and/or other suitable low-K dielectric material.

In some embodiments, an interlayer dielectric (ILD) 210 is formed over the substrate 202. The ILD 210 may include silicon oxide, a silicon oxide containing material, or a low-K dielectric layer, such as TEOS oxide, USG, doped silicon oxide, such as BPSG, FSG, PSG, BSG, and/or other suitable low-K dielectric material. In various examples, the ILD 210 may be deposited by chemical vapor deposition (CVD), physical vapor deposition (PVD), atomic layer deposition (ALD), or combinations thereof. As one example, the ILD 210 may have a thickness of about 200 nm. In other embodiments, the ILD 210 may have a thickness of between about 150 nm and about 250 nm. The ILD 210 may be conformally deposited and have a substantially uniform thickness.

In some examples, a carbide layer 220 is formed over the ILD 210. In some embodiments, the carbide layer 220 may be deposited by CVD, PVD, ALD, or combinations thereof. In some embodiments, the carbide layer 220 may include a silicon carbide (SiC) layer, although other types of carbide materials may be used. In some examples, the carbide layer 220 may have a thickness of about 55 nm. In other embodiments, the carbide layer 220 may have a thickness of between about 45 nm and about 65 nm. The carbide layer 220, in some embodiments, may be conformally deposited and have a substantially uniform thickness.

Still referring to FIG. 2A, the device 200 further includes a dielectric layer 230 formed over the carbide layer 220. In some embodiments, the dielectric layer 230 may include silicon oxide or a silicon oxide containing material. In some cases, the dielectric layer 230 may include USG. In various examples, the dielectric layer 230 may be deposited by plasma enhanced CVD (PECVD), high-density plasma CVD (HDP-CVD), sub-atmospheric CVD (SACVD), ALD, PVD, or a combination thereof. In some cases, the dielectric layer 230 may have a thickness of about 620 nm. In other embodiments, the dielectric layer 230 may have a thickness of between about 575 nm and about 675 nm. In some embodiments, the dielectric layer 230 may be conformally deposited and have a substantially uniform thickness.

In some embodiments, a dielectric layer 240 may be formed over the dielectric layer 230. In some cases, the dielectric layer 240 may include a nitrogen-containing material and/or a carbon-containing material. For example, the dielectric layer 240 may include silicon carbon nitride (SiCN), silicon oxycarbide (SiOC), silicon carbide (SiC), silicon oxycarbonitride (SiOCN), silicon nitride (SiN), or combinations thereof. In some embodiments, the dielectric layer 240 may have a thickness of about 50 nm. In other embodiments, the dielectric layer 240 may have a thickness of between about 45 nm and about 55 nm. In various examples, the dielectric layer 240 may be deposited by CVD, ALD, PVD, or combinations thereof. The dielectric layer 240 may, in some cases, function as an etch stop layer (ESL).

Still with reference to FIG. 2A, a dielectric layer 250 may be deposited over the dielectric layer 240. In some embodiments, the dielectric layer 250 includes silicon oxide or a silicon oxide containing material. In some cases, the dielectric layer 250 may include USG. In various examples, the dielectric layer 250 may be deposited by PECVD, HDP-CVD, SACVD, ALD, PVD, or a combination thereof. In some cases, the dielectric layer 250 may have a thickness of about 900 nm. In other embodiments, the dielectric layer 250 may have a thickness of between about 800 nm and about 1000 nm. In some embodiments, the dielectric layer 250 may be conformally deposited and have a substantially uniform thickness.

In some embodiments, a hard mask layer 250A may be deposited over the dielectric layer 250. In some embodiments, the hard mask layer 250A may include a nitrogen-containing material and/or a carbon-containing material. For example, the hard mask layer 250A may include SiOCN, SiCN, SiOC, SiC, SiN, or combinations thereof. In some examples, the hard mask layer 250A may have a thickness of about 60 nm. In some examples, the hard mask layer 250A may have a thickness of between about 50 nm and about 70 nm. In some examples, the hard mask layer 250A may be conformally deposited and have a substantially uniform thickness.

Turning to FIG. 2B, lower contact features are formed. The hard mask layer 250A may be patterned to form trenches. In various embodiments, a photolithography process (e.g., such as exposure and development) may be used to pattern the hard mask layer 250A. An etching process may be performed using the hard mask layer 250A to form the trenches in the dielectric layer 250. In some embodiments, a chemical mechanical planarization (CMP) process may be used to remove the hard mask layer 250A to expose the underlying dielectric layer 250.

In some embodiments, lower contact features 253, 254, 255 are formed in the trenches provided by the patterning of the dielectric layer 250. Although the lower contact features 253, 254, 255 are disposed below upper contact features (discussed below), the lower contact features 253, 254, 255 are sometimes referred to as top metal (TM) contacts because they represent a top metal layer of the MLI structure, previously discussed. In some embodiments, each of the lower contact features 253, 254, 255 may include a barrier layer 251A and a metal fill layer 251B. By way of example, formation of the lower contact features 253, 254, 255 includes multiple processes. In some embodiments, the barrier layer is formed in each of the trenches provided by the patterning of the dielectric layer 250, followed by the deposition of a metal fill layer over the barrier layer. In some embodiments, the barrier layer 251A includes titanium nitride, tantalum, tantalum nitride, or combinations thereof. In some embodiments, the metal fill layer 251B includes a metal or metal alloy such as copper, cobalt, nickel, aluminum, tungsten, titanium, or combinations thereof. In some embodiments, the metal fill layer is formed by deposition or plating. In some embodiments, a CMP process removes portions of the metal fill layer and the barrier layer disposed over a top surface of the dielectric layer 250, such that remaining portions of the metal fill layer and the barrier layer fill the trenches provided by the patterning of the dielectric layer 250 and provide the lower contact features 253, 254, 255.

Turning to FIG. 2C, a first passivation layer 252 is formed over device 200 including over the lower contact features 253, 254, 255 and the dielectric layer 250. In some embodiments, the first passivation layer 252 includes a dielectric layer 256 formed over the lower contact features 253, 254, 255. In some embodiments, the dielectric layer 256 is about 75 nm thick. In other embodiments, the dielectric layer 256 may have a thickness of between about 65 nm and about 85 nm. The dielectric layer 256 may include a nitrogen-containing material and/or a carbon-containing material. For example, the dielectric layer 256 may include SiCN, SiOC, SiC, SiOCN, SiN, or combinations thereof. In various examples, the dielectric layer 256 may be deposited by CVD, ALD, PVD, or combinations thereof. In some embodiments, the dielectric layer 256 may protect the lower contact features 253, 254, 255 from being oxidized.

The first passivation layer 252 may further include a dielectric layer 258 formed over the dielectric layer 256. In some embodiments, the dielectric layer 258 may include silicon oxide or a silicon oxide containing material. In some cases, the dielectric layer 258 may include USG. The dielectric layer 258 may be deposited by PECVD, HDP-CVD, SACVD, ALD, PVD, or a combination thereof. Thus, in some cases, the dielectric layer 258 may be referred to as a plasma-enhanced oxide (PEOX). In some cases, the dielectric layer 258 may have a thickness of about 300 nm. In other embodiments, the dielectric layer 258 may have a thickness of between about 250 nm and about 350 nm.

A metal-insulator-metal (MIM) structure is then formed over the first passivation layer 252. As discussed below, fabrication of a MIM capacitor structure involves multiple processes such as deposition and patterning of a bottom conductor plate layer, a middle conductor plate layer, and a top conductor plate layer, as well as formation of insulators between adjacent conductor plate layers of the MIM capacitor.

Turning to FIG. 2D, a patterned bottom conductor plate layer 262 is formed over the first passivation layer 252. By way of example, formation of the patterned bottom conductor plate layer 262 may involve multiple processes such as layer deposition, photolithography, development, and/or etching, etc. In an embodiment, the bottom conductor plate layer 262 may include a metal nitride layer such as titanium nitride (TiN), however other metals may likewise be used. The bottom conductor plate layer 262 may go through surface treatment such as sidewall passivation using a nitrous oxide (N₂O) gas. In some embodiments, the bottom conductor plate layer 262 is about 40 nm thick. In other embodiments, the bottom conductor plate layer 262 may have a thickness of between about 35 nm and about 45 nm.

Figure 3B:
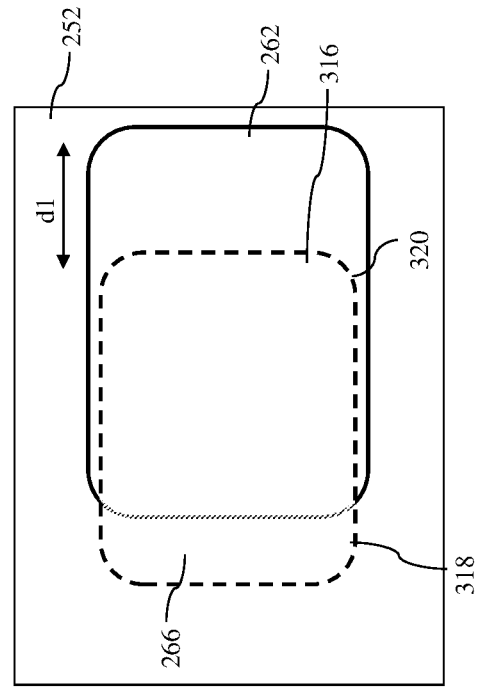
FIGS. 3A-3D are top down views of a metal-insulator-metal device at various fabrication steps (such as those associated with the method of FIG. 1 and/or FIG. 5) according to various aspects of the present disclosure.
Figure 3A:
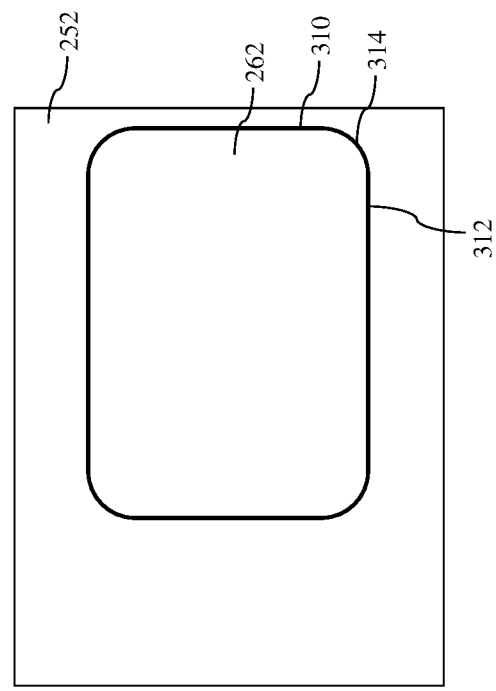

Referencing FIGS. 3A-3D, top down views of device 200 during various fabrication steps of the MIM device 200 are illustrated. Specifically, FIGS. 3A-3D illustrate the formation of various metal layers on device 200 and the upper contact layers on device 200. Each of these steps will be discussed further below. Turning to FIG. 3A, a top down view of device 200 is illustrated according to embodiments of the present disclosure. The bottom conductor plate layer 262 is disposed over the first passivation layer 252 and may be generally rectangular-shaped. In some embodiments, other shapes may be used. For example, the bottom conductor plate layer 262 has four sides and four corners. The bottom conductor plate layer 262 includes first sides 310 extending in a first direction and substantially parallel to one another and second sides 312 extending in a second direction and substantially parallel to one another, where the second direction is perpendicular to the first direction. The intersection of the first sides 310 and the second sides 312 form corners 314 which may be rounded during formation of bottom conductor plate layer 262.

Generally, after forming a metal layer such as the bottom conductor plate layer 262, each of the corners of the metal layer have an angle of about 90°. Square corners, such as 90° corners, are a weak point for a metal layer and specifically for a MIM device, such as device 200. External stresses may concentrate at the corners causing them to crack and/or fail. Some examples of external stresses may include thermal stress, stress arising from the formation of further features on top of the metal layer, and stress arising from closely spaced device structures, such as where metal layers of the device structures that are in a same level (or the same plane) (for example, formed in a same dielectric layer) have edges and/or corners that are in close proximity, such as when a MIM device is formed directly adjacent to another MIM device. Failure at the corners of the metal layer may lead to passivation crash (e.g., failure of the passivation layer to properly protect the underlying layers) and yield loss (e.g., failure of the device to function as designed). Such stresses and corner failure can lead to cracks within the metal layer and/or a dielectric layer and/or a passivation layer in which the metal layer is disposed. For example, cracks have been observed at corner areas of adjacent MIM devices, where the cracks extend from one or more metal layers of a MIM device through the dielectric layers and/or the passivation layers to another one or more metal layers of another MIM device, such as between the bottom conductor plate layers and/or other conductor plate layers of the adjacent MIM devices. The present disclosure has recognized that smoothing and/or rounding one or more corners of a MIM device mitigates, or reduces, the accumulation of external stress at the corners of the conductor plate layers of the MIM device. This mitigation of the external stress reduces passivation failures and increases yield during manufacturing.

As depicted in FIG. 3A, bottom conductor plate layer 262 may be formed with rounded corners 314. Generally, corners of a conductive plate layer, such as bottom conductor plate layer 262, may be rounded during a photolithography process. Such natural rounding may provide corners rounded to less than 0.1 μm. However, this natural rounding may not be sufficient to mitigate the stresses at the corners of the conductor. Further, intentional, rounding of the corners of the conductive plate layer may be performed to provide corners rounded to greater than 0.1 μm.

In some embodiments, the rounding process may be achieved by an optical proximity correction (OPC) process. In some embodiments, the OPC process may be a reverse OPC process. For example, an IC design layout that includes a bottom conductor plate pattern for a MIM device (e.g., where the bottom conductor plate pattern is a rectangle with four square corners) may undergo an OPC process to generate a mask layout having a modified bottom conductor plate pattern, such as a rectangle with at least one rounded corner or a rectangle with four square corners having one or more OPC features added thereto or added proximate thereto. A mask can then be fabricated that includes the modified bottom conductor plate pattern, and the mask can be used when patterning the bottom conductor plate layer 262, thereby providing bottom conductor plate layer 262 with rounded corners 314. In some embodiments, the rounding process is achieved by tuning parameters of the deposition, photolithography, development, and/or etching of the bottom conductor plate layer 262. The OPC process may be sufficient to round, or smooth, the corners of the bottom conductor plate layer 262 to mitigate external stresses of the MIM device of device 200. Reducing the sharpness of the angle of the corner reduces stress buildup at the corner. Rounding the corner may include chamfering, filleting, beveling, etc. Smoothing the corners in one of these ways allows the stress to be spread across more area of the metal layer and/or reduces stress at a single point because of the increased support provided by the surrounding dielectric layer. The rounded corners may be convex curving surfaces that form the intersections of the first sides 310 and the second sides 312, instead of square corners. In some embodiments, the rounded corners 314 may have a radius of between about 0.1 μm and about 0.5 μm.

In some other embodiments, additional photolithography, development, and/or etching processes may be performed to round the corners of the bottom conductor plate layer 262 after patterning the bottom conductor plate layer 262. After such a process, the corners of the bottom conductor plate layer 262 may be rounded as depicted in FIG. 3A. In some other examples, the corners may be chamfered, resulting in a corner with a straight edge instead of a point or a rounded corner. Regardless of which embodiment is used to smooth the corners of bottom conductor plate layer 262, either during or after formation of patterned bottom conductor plate layer 262, external stresses are mitigated by removing the square, or about 90°, corners, and providing bottom conductor plate layer 262 with rounded corners 314, which benefits device 200. In the depicted embodiment, bottom conductor plate layer 262 has four rounded, smooth corners 314. In some embodiments, bottom conductor plate 262 has one, two, or three rounded, smooth corners 314, and three, two, or one square or other shaped and/or other profile corners. In some embodiments, a corner of bottom conductor plate layer 262 is rounded when the corner is in lateral, close proximity to another metal feature, such as another bottom conductor plate layer of another MIM device. In some embodiments, the corners are considered in lateral, close proximity when a diagonal distance between corners of two different metal features is less than about 1 μm.

Figure 4:
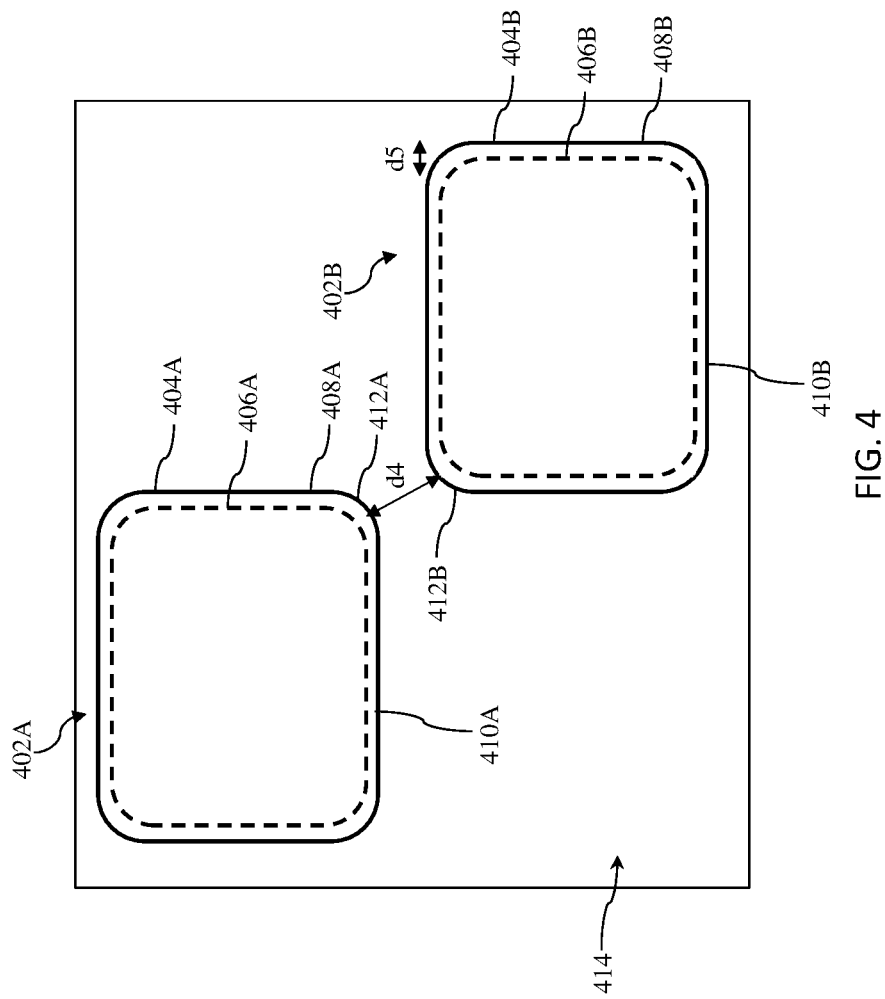
FIG. 4 is a top down view of two fabricated metal-insulator-metal devices (such as in accordance with the methods of FIG. 1 and/or FIG. 5) according to various aspects of the present disclosure.

FIG. 4 illustrates a top down view of a first MIM device 402A and a second MIM device 402B in close proximity to first MIM device 402A. First MIM device 402A includes a first metal layer 404A, an insulator layer disposed over the first metal layer 404A, and a second metal layer 406A disposed over the insulator layer. First metal layer 404A includes first sides 408A extending in a first direction and substantially parallel to one another and second sides 410A extending in a second direction and substantially parallel to one another, where the second direction is perpendicular to the first direction. The intersection of the first sides 408A and the second sides 410A forms corners 412A. Second MIM device 402B includes a first metal layer 404B, an insulator layer disposed over first metal layer 404B, and a second metal layer 406B disposed over the insulator layer. First metal layer 404B includes first sides 408B extending in a first direction and substantially parallel to one another and second sides 410B extending in a second direction and substantially parallel to one another, where the second direction is perpendicular to the first direction. The intersection of the first sides 408B and the second sides 410B forms corners 412B. A dielectric layer 414 is disposed around, including on top and surrounding sides of, first MIM device 402A and second MIM device 402B and between adjacent corners 412A and 412B. No other metal layers are between corners 412A and 412B along a diagonal distance d4. Distance d4 is about 1 μm to about 5 μm. Rounded corners 412A and 412B mitigate the accumulated stresses caused by the close proximity of metal layer 404A and metal layer 404B. In some embodiments, the MIM structures may be shifted away from each by about 0.01 μm to about 0.99 μm to reduce the stress on the corners of the metal layers 404A and 404B.

In the depicted embodiment, using second MIM device 402B as an example, sides of second metal layer 406B may be offset from first side 408B and second side 410B of first metal layer 404B by a distance d5 in order to reduce accumulated stress in second MIM device 402B. Distance d5 may be about 5% to about 20% of the length of first side 408B. In some embodiments, second metal layer 406B may be laterally offset by distance d5 such that a portion of second metal layer 406B is not disposed over first metal layer 404B. If distance d5 is less than about 5% then stress may accumulate and cause damage to second MIM device 402B. If distance d5 is greater than about 20% then the performance of second MIM device 402B may be degraded. In some other embodiments, second metal layer 406B may have the same dimensions as first metal layer 404B. In yet some other embodiments, second metal layer 406B may be larger than first metal layer 404B by distance d5.

Turning now to FIG. 2E, an insulator layer 264 is formed over the device 200 including over the bottom conductor plate layer 262. In an embodiment, the insulator layer 264 is conformally deposited and has a generally uniform thickness over the top surface of the device 200 (e.g., having about the same thickness on top and sidewall surfaces of the bottom conductor plate layer 262). As shown in FIG. 2F, a patterned middle conductor plate layer 266 is formed over the device 200 including over the insulator layer 264. The middle conductor plate layer 266 may be formed in a way similar to that used to form the bottom conductor plate layer 262, but the pattern of the middle conductor plate layer 266 may be different from that of the bottom conductor plate layer 262. In an embodiment, the middle conductor plate layer 266 may include a metal nitride layer such as TiN, however other metals may be used. In some embodiments, the middle conductor plate layer 266 is about 40 nm thick. In other embodiments, the middle conductor plate layer 266 may have a thickness of between about 35 nm and about 45 nm.

Turning to FIG. 3B, a top down view of device 200 after the formation of the middle conductor plate layer 266 is illustrated. For ease of discussion and clarity of description, insulator layer 264 is not illustrated as being between the bottom conductor plate layer 262 and the middle conductor plate layer 266 in the top view of FIG. 3B of device 200. As seen in FIG. 2F and FIG. 3B, the middle conductor plate layer 266 is disposed over, and laterally offset from, the bottom conductor plate layer 262 a distance d1 such that a portion of middle conductor plate layer 266 is not disposed over bottom conductor plate layer 262. Distance d1 may be about 5% to about 30% of the length of second side 312 of bottom conductor plate layer 262. If distance d1 is less than about 5% of the length of second side 312, then structural stress may accumulate and damage device 200. If distance d1 is greater than about 30% of the length of second side 312 then the performance of device 200 may be degraded. In the depicted embodiment, middle conductor plate layer 266 is laterally offset in a X direction to the left of bottom conductor plate layer 262. In some embodiments, middle conductor plate layer 266 may be laterally offset in the X direction to the right of bottom conductor plate layer 262. In some other embodiments, middle conductor plate layer 266 may be laterally offset in a Y direction in either direction where the Y direction is orthogonal to the X direction. Furthermore, while middle conductor plate layer 266 is depicted as being smaller than bottom conductor plate layer 262, middle conductor plate layer 266 may be the same dimensions or larger than bottom conductor plate layer 262.

As discussed above with respect to the bottom conductor plate layer 262 depicted in FIG. 3A, in some embodiments, the middle conductor plate layer 266 has a generally rectangular-shaped (e.g., having first sides 316 extending along the first direction and second sides 318 extending along the second direction), where intersections of the first sides 316 and second sides 318 of middle conductor plate layer 266 may be formed by rounded corners 320 as depicted in FIG. 3B, such as described with respect to bottom conductor plate layer 262 above. The middle conductor plate layer 266 may be formed having rounded corners 320 by the processes described above with respect to the bottom conductor plate layer 262 (e.g., OPC, photolithography, development, and/or etching processes). Middle conductor plate layer 266 with rounded corners 320 can provide the same benefits to the middle conductor plate layer 266, MIM device having the middle conductor plate layer 266, and/or device 200 as those described above with respect to the bottom conductor plate layer 262. In some embodiments, the rounded corners 320 may have a radius of about 0.1 µm and about 0.5 µm.

As shown in FIG. 2G, an insulator layer 268 is formed over the device 200 including over the middle conductor plate layer 266. In an embodiment, the insulator layer 268 is conformally deposited and has a generally uniform thickness over the top surface of the device 200 (e.g., having about the same thickness on top and sidewall surfaces of the middle conductor plate layer 266). As shown in FIG. 2H, a patterned top conductor plate layer 269 is formed over the device 200 including over the insulator layer 268. The top conductor plate layer 269 may be formed in a way similar to that used to form the middle conductor plate layer 266 or the bottom conductor plate layer 262, but the pattern of the top conductor plate layer 269 may be different from that of the middle conductor plate layer 266 or the bottom conductor plate layer 262. In an embodiment, the top conductor plate layer 269 may include a metal nitride layer such as titanium nitride (TiN), however other metals may be used. In some embodiments, the top conductor plate layer 269 is about 40 nm thick. In other embodiments, the top conductor plate layer 269 may have a thickness of between about 35 nm and about 45 nm.

Figure 3D:
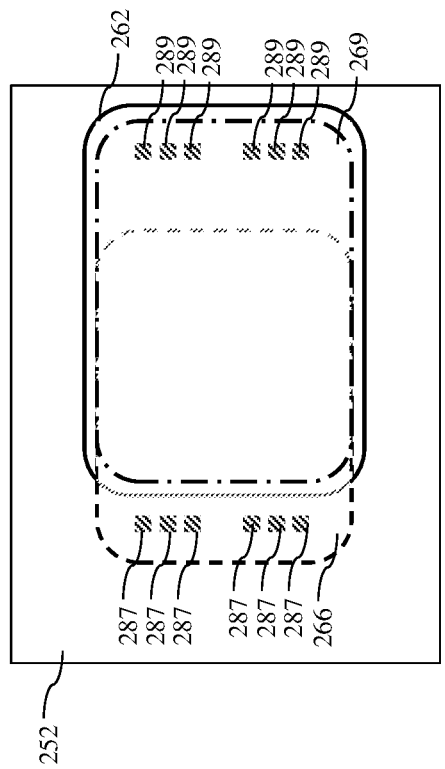
Figure 3C:
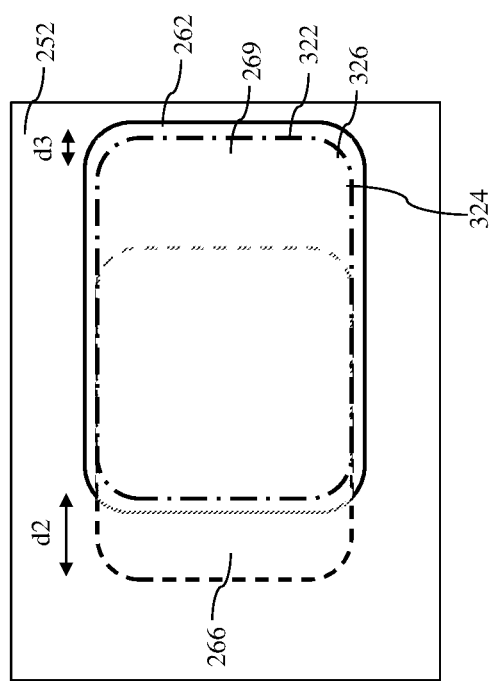

Turning to FIG. 3C, a top down view of device 200 after the formation of the top metal plate layer 269 is illustrated. For ease of discussion and clarity of description, insulator layer 264 is not illustrated as being between the bottom conductor plate layer 262 and the middle conductor plate layer 266 it is present in device 200 and insulator layer 268 is not illustrated as being between the middle conductor plate layer 266 and the top conductor plate layer 269 in the top view of FIG. 3C of device 200. As seen in FIG. 2H and FIG. 3C, the top conductor plate layer 269 is disposed over, and laterally offset from, the middle conductor plate layer 266 a distance d2 such that a portion of top conductor plate layer 269 is not disposed over middle conductor plate layer 266. Top conductor plate layer 269 is further disposed over, and laterally offset from, the bottom conductor plate layer 262 a distance d3. Distance d2 may be about 5% to about 25% of the length of second side 318 of middle conductor plate layer 266. If distance d2 is less than about 5% of the length of second side 318 then stress may accumulate and damage device 200. If distance d2 is greater than about 25% then the performance of device 200 may be degraded. Distance d3 may be about 0% to about 10% of the length of second side 312 of bottom conductor plate layer 262. If distance d3 is greater than about 10% then the performance of device 200 may be degraded. Insulator layers 264, 268 provide structural support between bottom conductor plate layer 262 and top conductor plate layer 269 and may reduce stress such that device 200 may not be damaged. In the depicted embodiment, top conductor plate layer 269 is laterally offset in the X direction to the right of middle conductor plate layer 266. In some embodiments, top conductor plate layer 269 may be laterally offset in the X direction to the left of middle conductor plate layer 266. In some other embodiments, top conductor plate layer 269 may be laterally offset in the Y direction from the middle conductor plate 266. Furthermore, in some embodiments, top conductor plate layer 269 may have the same dimensions or may be larger than either the middle conductor plate layer 266 or bottom conductor plate layer 262.

As discussed above with respect the bottom conductor plate layer 262 depicted in FIGS. 3A, in some embodiments, the top conductor plate layer 269 has a generally rectangular-shaped (e.g. having first sides 322 extending along the first direction and second sides 324 extending along the second direction), where intersections of the first sides 322 and second sides 324 of top conductor plate layer 269 may be formed by rounded corners 326 as depicted in FIG. 3C, such as described with respect to bottom conductor plate layer 262 above. The top conductor plate layer 269 may be formed having rounded corners 326 by the processes described above with respect to the bottom conductor plate layer 262 (e.g., OPC, photolithography, development, and/or etching processes). Top conductor plate layer 269 with rounded corners 326 can provide the same benefits to the top conductor plate layer 269, MIM device having the top conductor plate layer 269, and/or device 200 as those described above with respect to the bottom conductor plate layer 262. In some embodiments, the rounded corners 326 may have a radius of about 0.1 µm and about 0.5 µm.

Thus, as shown in FIG. 2H, a MIM structure 260 has been formed and includes multiple metal layers including the bottom conductor plate layer 262, the middle conductor plate layer 266, and the top conductor plate layer 269, which function as metal plates of capacitors. Each of the conductor plate layers 262, 266, 269 of MIM structure 260 have rounded corners, which mitigate external stresses on MIM structure 260 that may be caused through lateral proximity to other structures and/or additional structures being formed over MIM structure 260. The MIM structure 260 also includes multiple insulator layers including the insulator layer 264 disposed between the bottom conductor plate layer 262 and the middle conductor plate layer 266, as well as the insulator layer 268 disposed between the middle conductor plate layer 266 and the top conductor plate layer 269. By way of example, the MIM structure 260 may be used to implement one or more capacitors, which may be connected to other microelectronic components (e.g., including active and/or passive devices, described above). In addition, and in some embodiments, the multi-layer MIM structure 260 allows capacitors to be closely packed together in both vertical and lateral directions, thereby reducing an amount of lateral space needed for implementing capacitors. As a result, the MIM structure 260 may accommodate super high-density capacitors.

In some embodiments, and to increase capacitance values, the insulator layer 264 and/or the insulator layer 268 may include high-k dielectric material(s) having a dielectric constant (k-value) larger than that of silicon oxide. In various examples, the insulator layers 264, 268 may be relatively thin to further provide increased capacitance values, while maintaining sufficient thicknesses to avoid potential dielectric breakdown of the capacitors in the MIM structure 260 (e.g., when two capacitor plates have high potential difference, current may leak between the plates, causing breakdown). In some embodiments, each of the insulator layers 264, 268 is about 6 nm thick. In other embodiments, each of the insulator layers 264, 268 is between about 5 nm and about 7 nm thick. Further, to optimize the capacitor performance, in some embodiments, the insulator layer 264 (or the insulator layer 268) may include a tri-layer structure including, from bottom to top, a first zirconium oxide ($ZrO_2$) layer, an aluminum oxide ($Al_2O_3$) layer, and a second zirconium oxide ($ZrO_2$) layer. In some embodiments, each of the layers of the tri-layer structure is between about 1.5 nm and about 2.5 nm thick.

Turning to FIG. 2I, a dielectric layer 270 is formed over device 200 including over the MIM structure 260. The dielectric layer 270 may include silicon oxide or a silicon oxide containing material. In some cases, the dielectric layer 270 may include USG. The dielectric layer 270 may be deposited by PECVD, HDP-CVD, SACVD, ALD, PVD, or a combination thereof. Thus, in some cases, the dielectric layer 270 may be referred to as a plasma-enhanced oxide (PEOX). In some examples, the dielectric layer 270 may have a thickness of about 550 nm. In some examples, the dielectric layer 270 may have a thickness between about 500 nm and about 600 nm. While the dielectric layer 270 may have a uniform top surface, the thickness of dielectric 270 may vary depending on the thickness of MIM structure 260 and/or a pattern of the bottom conductor plate layer 262, the middle conductor plate layer 266, and the top conductor plate layer 269.

Turning to FIG. 2J, openings 284, 286, 288 are formed. The opening 284 may penetrate through, from top to bottom, the dielectric layer 270, the insulator layers 268, 264 and the first passivation layer 252 (including the dielectric layer 258 and the dielectric layer 256) to expose a top surface of the lower contact feature 253. The opening 286 may penetrate through, from top to bottom, the dielectric layer 270, a portion of the MIM structure 260 (including the insulator layer 268, the middle conductor plate layer 266, and the insulator layer 264), and the first passivation layer 252 to expose a top surface of the lower contact feature 254. The opening 288 may penetrate through, from top to bottom, the dielectric layer 270, a portion of the MIM structure 260 (including the top conductor plate layer 269, the insulator layers 268, 264, and the bottom conductor plate layer 262), and the first passivation layer 252 to expose a top surface of the lower contact feature 255. In some embodiments, the openings 284, 286, 288 may be formed using a suitable combination of photolithography processes (e.g., such as photoresist deposition, exposure, and development) and an etching process (e.g., such as a dry etching process, a wet etching process, or a combination thereof). In various embodiments, sidewalls of each of the openings 284, 286, 288 may expose sidewalls of the various layers through which the openings 284, 286, 288 penetrate.

Turning to FIG. 2K, upper contact features 285, 287, 289 are formed in and over each of the openings 284, 286, 288, respectively. The upper contact features 285, 287, 289 include contact vias that fill the openings 284, 286, 288 and may be referred to as contact vias, metal vias, or metal lines. In some embodiments, to form the upper contact features 285, 287, 289, a barrier layer is first conformally deposited over the dielectric layer 270 and into the openings 284, 286, 288 using a suitable deposition technique, such as ALD, PVD, or CVD, and then a metal fill layer is deposited over the barrier layer using a suitable deposition technique, such as ALD, PVD, or CVD. The deposited barrier layer and the metal fill layer are then patterned to form a barrier layer 281A and a metal fill layer 281B for each of the upper contact features 285, 287, 289. In some cases, the upper contact features 285, 287, 289 may be referred to as contact pads. In some embodiments, the barrier layer and the metal fill layer are patterned in a two-stage or multiple-stage etch process. In the example of FIG. 2K, portions of the upper contact features 285, 287, 289 above the dielectric layer 270 have substantially straight sidewalls. However, in some alternative embodiments, portions of the upper contact features 285, 287, 289 above the dielectric layer 270 may have tapered sidewalls. In some embodiments, barrier layer 281A includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, metal fill layer 281B includes tungsten, ruthenium, cobalt, copper, aluminum, iridium, palladium, platinum, nickel, low resistivity metal constituent, alloys thereof, or combinations thereof.

In some embodiments, an upper portion of the upper contact features 285, 287, 289 are part of a redistribution layer (RDL) that includes various metal lines used to redistribute bonding pads to different locations, such as from peripheral locations to being uniformly distributed on chip surface. In various examples, the RDL couples the multilayer interconnect (MLI) structure to the bonding pads, for connection to external circuitry. The upper contact features 285, 287, 289 provide electrical contact to the lower contact features 253, 254, 255, respectively. In addition, and as shown in the example of FIG. 2K, the upper contact feature 287 is electrically coupled to the middle conductor plate layer 266, while being electrically isolated from the bottom conductor plate layer 262 and the top conductor plate layer 269. Further, the upper contact feature 289 is electrically coupled to the bottom conductor plate layer 262 and the top conductor plate layer 269, while being electrically isolated from the middle conductor plate layer 266. Thus, the upper contact feature 287 provides electrical contact to a first terminal of the MIM structure 260, and the upper contact feature 289 provides electrical contact to a second terminal of the MIM structure 260. It is also noted that the upper contact features 285, 287, 289, being disposed above (or near) the MIM structure 260, may induce stress that is mitigated by the rounded, or smooth, corners of the conductor plate layers 262, 266, 269, thereby preventing the formation of cracks and/or other defects within MIM structure 260 and/or the surrounding area.

Turning to FIG. 3D, a top down view of device 200 after the formation of the vias 287 and vias 289 is illustrated. As illustrated in both FIG. 2K and FIG. 3D, vias 287 are formed passing through middle conductor plate layer 266, including through insulator layers 264, 268. Vias 289 are formed passing through top conductor plate layer 269 and bottom conductor plate layer 262, including through insulator layers 264, 268. Vias 287, 289 pass through MIM device 200 and connect to contact features 254 and 255 respectively. Contact features 254, 255 may provide electrical connection for MIM device 200.

Turning to FIG. 2L, a second passivation layer 290 is formed over device 200 including over the upper contact features 285, 287, 289 and over the dielectric layer 270. In some embodiments, the second passivation layer 290 includes a dielectric layer 291 formed over the upper contact features 285, 287, 289 and over the dielectric layer 270. In some embodiments, the dielectric layer 291 may include silicon oxide or a silicon oxide containing material. In some cases, the dielectric layer 291 may include USG. The dielectric layer 291 may be deposited by PECVD, HDP-CVD, SACVD, ALD, PVD, or a combination thereof. Thus, in some cases, the dielectric layer 291 may be referred to as a plasma-enhanced oxide (PEOX). In some cases, the dielectric layer 291 may have a thickness of about 1200 nm. In other embodiments, the dielectric layer 291 may have a thickness of between about 1000 nm and about 1400 nm. In some examples, the second passivation layer 290 further includes a dielectric layer 292 formed over the dielectric layer 291. In some embodiments, the dielectric layer 292 is about 700 nm thick. In other embodiments, the dielectric layer 292 may have a thickness of between about 600 nm and about 800 nm. The dielectric layer 292 may include a nitrogen-containing material and/or a carbon-containing material. For example, the dielectric layer 292 may include SiCN, SiOC, SiC, SiOCN, SiN, or combinations thereof. In various examples, the dielectric layer 292 may be deposited by CVD, ALD, PVD, or combinations thereof. It is further noted that stress induced by the second passivation layer 290 (including the dielectric layers 291, 292) on MIM structure 260 may be mitigated by the round, or smooth, corners of the conductor plate layers 262, 266, 269, thereby preventing the formation of cracks and/or other defects within the MIM structure 260 and/or the surrounding area.

Turning to FIG. 2M, openings 293, 294, 295 are formed. In some embodiments, each of the openings 293, 294, 295 may penetrate through, from top to bottom, the dielectric layer 292 and the dielectric layer 291 of the second passivation layer 290 to expose top surfaces of the upper contact features 285, 287, 289, respectively. In some embodiments, the openings 293, 294, 295 may be formed using a suitable combination of photolithography processes (e.g., such as photoresist deposition, exposure, and development) and an etching process (e.g., such as a dry etching process, a wet etching process, or a combination thereof). In various embodiments, sidewalls of each of the openings 293, 294, 295 may expose sidewalls of the various layers through which the openings 293, 294, 295 penetrate.

Turning to FIGS. 2N and 2O, a patterned polyimide (PI) layer is formed. Formation of the patterned PI layer includes multiple steps including deposition of the PI layer and patterning of the PI layer. A PI layer 300 is first conformally deposited over the dielectric layer 292 and into the openings 293, 294, 295 using a suitable deposition technique, such as spin-coating. In some examples, the PI layer 300 may have a thickness of between about 5 µm and about 10 µm. In some embodiments, a baking process may be performed after deposition of the PI layer 300. The deposited PI layer 300 may then be patterned using a suitable combination of photolithography processes (e.g., such as photoresist deposition, exposure, and development) to form an etch mask, and an etching process may be performed using the etch mask to form openings 302, 304, 306 that expose top surfaces of the upper contact features 285, 287, 289, respectively. In at least some embodiments, the PI layer 300 includes a photosensitive chemical, such that the PI layer 300 may be simply patterned by a photolithography process, without a subsequent etch process. In various embodiments, stress induced by the PI layer 300 on the MIM structure 260 may be mitigated by the round, or smooth, corners of the conductor plate layers 262, 266, 269, thereby preventing the formation of cracks and/or other defects within the MIM structure 260 and/or the surrounding area.

Turning to FIG. 2P, a bumping process is performed. The bumping process includes forming of under-bump metallization (UBM) 303, a copper (Cu) pillar 305 (or Cu bump) over the UBM 303, and a solder bump 307 over the Cu pillar 305. In some embodiments, the UBM 303 provides a low resistance electrical connection to the RDL within the upper portion of the upper contact features 285, 287, 289. The UBM 303 also hermetically seals and prevents diffusion of other bump metals into the device 200. In various examples, the UBM 303 includes multiple layers of different metals such as an adhesion layer (e.g., Ti, Cr, Al, or a combination thereof), a diffusion barrier layer (e.g., CrCu alloy), a solderable layer, and an oxidation barrier layer (e.g., Au). The various layers of the UBM 303 may be deposited by electroplating, sputtering, evaporation, or other suitable method. In some embodiments, a Cu seed layer may be deposited prior to formation of the Cu pillar 305, which may be formed by an electroplating process. In addition, and in some cases, a diffusion barrier (e.g., such as Ni) may be formed between the Cu pillar 305 and the solder bump 307, to prevent formation of an intermetallic layer and/or to prevent the formation of microvoids. After formation of the Cu pillar 305, a plating process may be used to form the solder bump 307 over the Cu pillar 305. One or more patterning processes (e.g., lithography and/or etching processes) may be performed to pattern one or more of the layers deposited during the bumping process. In some embodiments, a reflow process may also be performed after deposition of the solder to form the solder bump 307. By way of example, formation of the UBM 303, the Cu pillar 305, and the solder bump 307 provide contact structures for connection to external circuitry. In some examples, stress induced by the UBM 303, the Cu pillar 305, and/or the solder bump 307 on the MIM structure 260 may be mitigated by the round, or smooth, corners of the conductor plate layers 262, 266, 269, thereby preventing the formation of cracks and/or other defects within the MIM structure 260 and/or the surrounding area.

It is understood that the method 100, discussed above with reference to FIGS. 2A-2P and FIGS. 3A-3D, is merely exemplary and is not intended to limit the present disclosure to what is explicitly shown and described with reference to the method 100. For example, while the bottom conductor plate layer 262, the middle conductor plate layer 266, and the top conductor plate layer 269 have been described as having rounded corners, each of the conductor plate layers 262, 266, 269 may be formed without rounding all of the corners without departing from the scope of the present disclosure. Thus, in some examples, the bottom conductor plate layer 262 and the top conductor plate layer 269 may have round corners. In some other examples, the exposed corners of the bottom conductor plate layer 262 and the middle conductor plate layer 266 may be rounded while the unexposed corners may not be rounded. In some examples, an unexposed corner is one that is disposed below another conductor plate layer.

Figure 5:
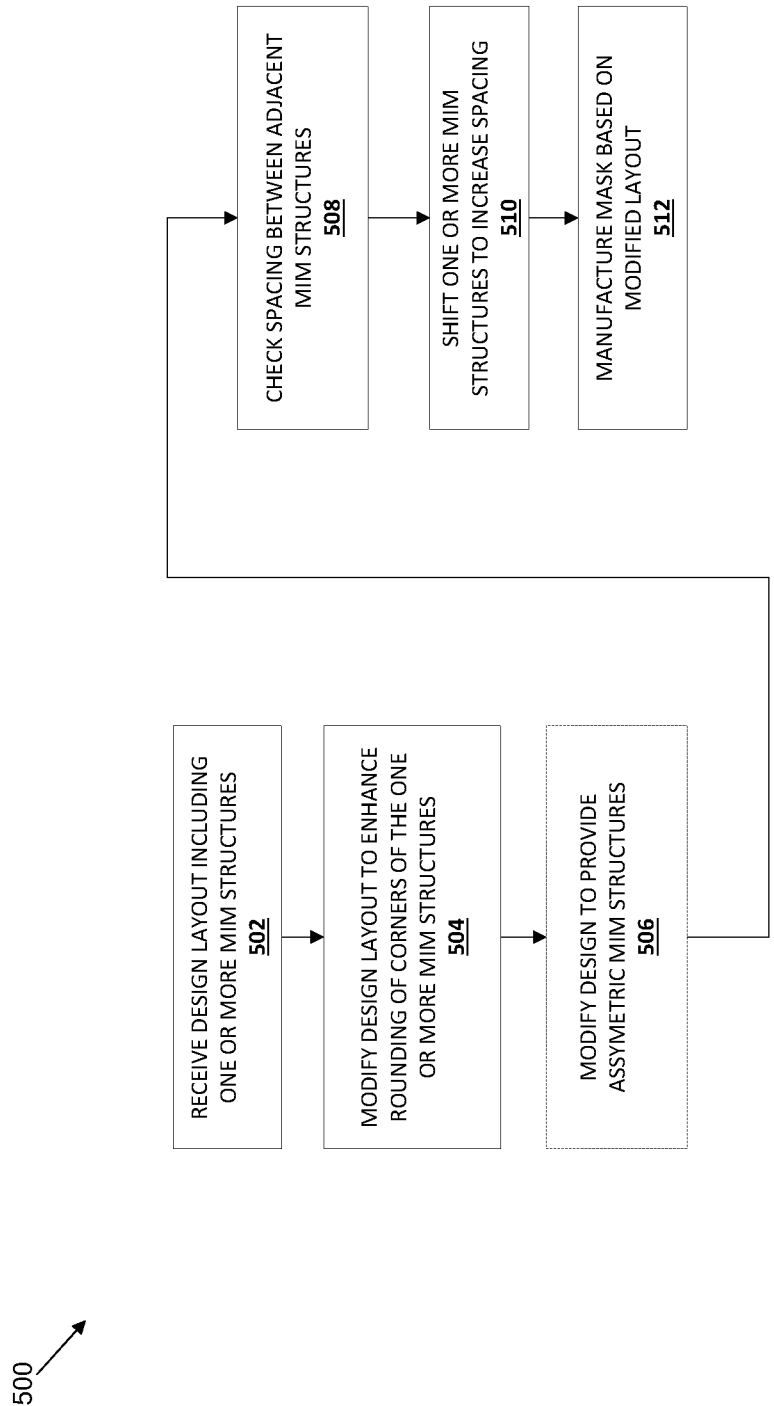
FIG. 5 is a flow chart of a method for manufacturing a mask used to fabricate a metal-insulator-metal device according to various aspects of the present disclosure.

FIG. 5 is a flow chart of a method 500 for manufacturing a mask for fabricating a metal-insulator-metal (MIM) device according to various aspects of the present disclosure. At block 502, receive a design layout including one or more MIM structures. At block 504, modify the design layout to enhance the rounding of the corners of the one or more MIM structures. At block 506, optionally modify the one or more MIM structures to have an asymmetric structure to reduce delamination issues caused by stress. At block 508, check the spacing between adjacent MIM structures. At block 510, shift one or more MIM structures to increase the spacing between adjacent MIM structures. In some embodiments, if the distance between two MIM structures is below a threshold, then one or more MIM structures may be shifted away from each other by about 0.01 μm to about 0.99 μm. In some embodiments, the threshold may be about 0.5 μm to about 2 μm. At block 512, manufacture a mask based on the modified layout.

Figure 6C:
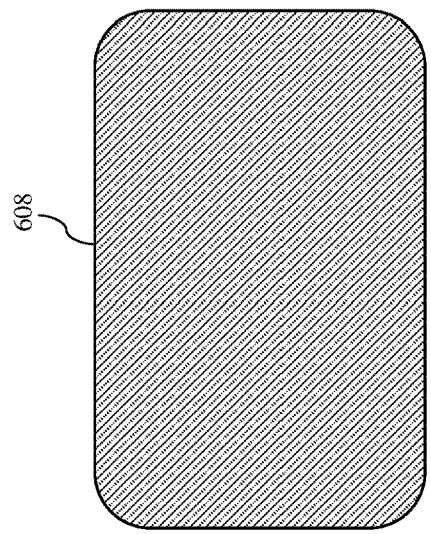
FIGS. 6A-6G are top down views of a design layout, portions of photo masks, and resulting MIM layer according to various aspects of the present disclosure.
Figure 6B:
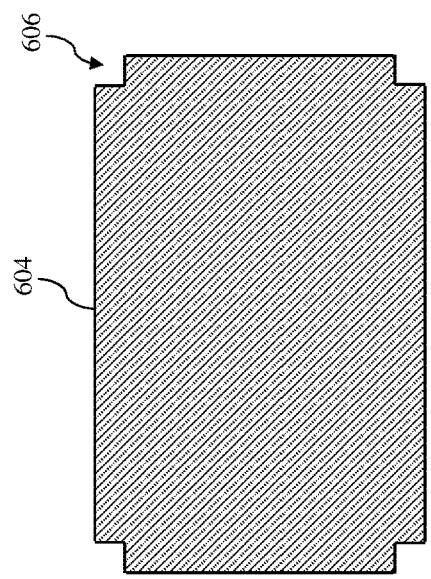
Figure 6A:
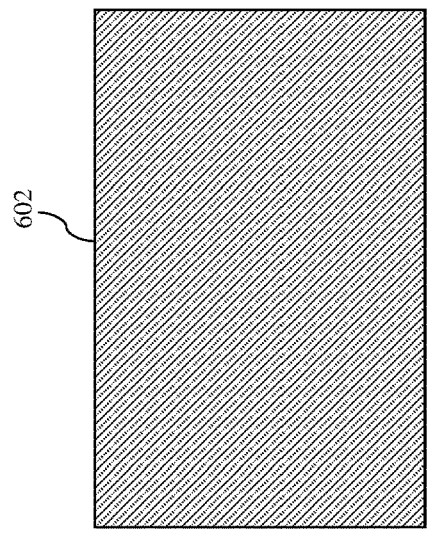

FIGS. 6A-6G illustrate a top down view of an exemplary design layout, portions of a photo mask, and a resulting MIM layer according to various aspects of the present disclosure. A design layer may be used to fabricate a photo mask, including portions described herein, for each metal layer of an MIM device (e.g., bottom conductor plate layer 262, middle conductor plate layer 266, and/or top conductive plate layer 269). The fabricated photo masks may result in each metal layer having a lateral offset from the previous metal as previously discussed. FIG. 6A illustrates an exemplary design layout for a metal layer 602. As illustrated, metal layer 602 is designed having square corners. Generally, a photolithography process produces a layer having rounded corners instead of the square corners, as designed. However, the naturally occurring rounding of the corners results in the corners being rounded less than 0.1 μm which does not provide sufficient stress protection. Additional processing steps may be used to produce corners rounded to greater than 0.1 μm.

Figure 6D:
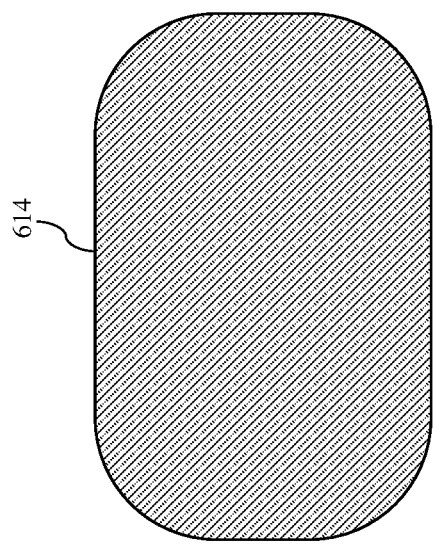
Figure 6E:
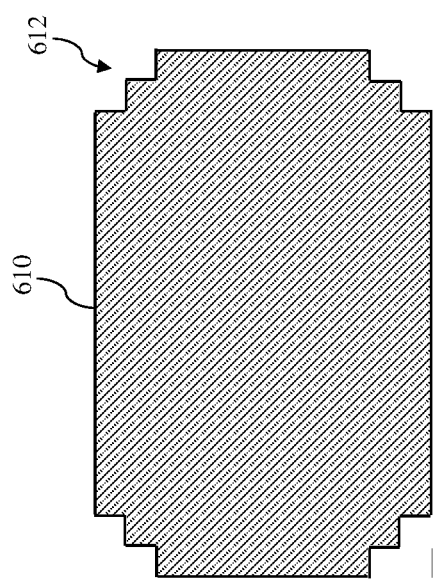

FIG. 6B illustrates an exemplary portion 604 of a photo mask for producing rounded corners that are greater than 0.1 μm according to various aspects of the present disclosure. As illustrated, portions 606 are removed from the portion 604 of the photo mask as part of a reverse OPC process. Using a mask, including portion 604, having portions 606 removed from the corners may result in corners that are sufficiently rounded to provide greater stress protection. FIG. 6C illustrates a top view of an exemplary layer 608 having corners sufficiently rounded for stress protection. FIG. 6D illustrates a portion 610 of a photo mask including portions 612 removed from corners of the portion 610 of the photo mask. As shown, portions 612 are larger than portions 606. By removing a larger portion of each corner of the portion 610 of the photo mask, the resulting layer may have increased rounding at each of the corners. FIG. 6E illustrates an exemplary layer 614 formed using the portion 610 of the photo mask. As seen, the corners of layer 614 have an increased rounding as compared to the corners of layer 608, and therefor may provide greater stress protection. In some embodiments, the shape, size, and/or location of portions 606, 612 may be a rule-based determination. In some embodiments, the shape, size, and/or location of portions 606, 612 may be a model-based determination.

Figure 6G:
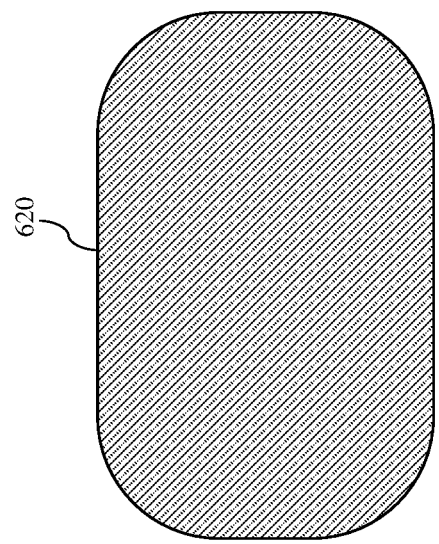
Figure 6F:
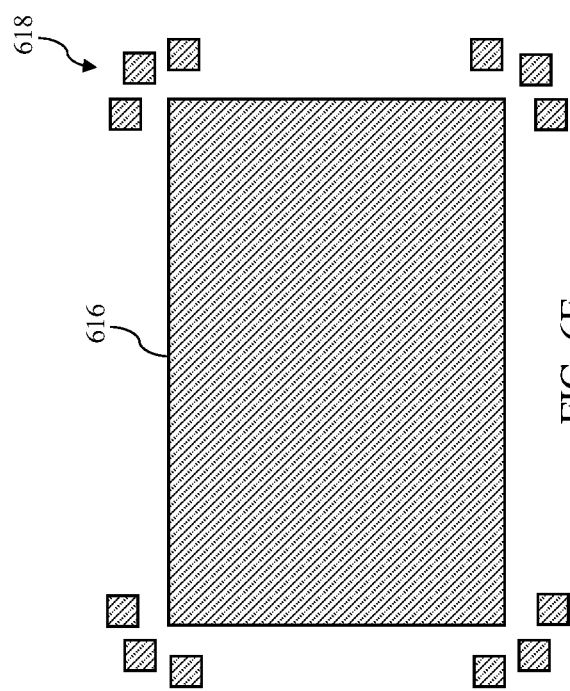

FIG. 6F illustrates an exemplary portion 616 of a photo mask for producing rounded corners that are greater than 0.1 μm according to various aspects of the present disclosure. Depicted is an OPC process including one or more sub-resolution features 618 that may be used to form rounded corners of a material layer. As illustrated, portion 616 of the photo mask includes three sub-resolution features 618 at each corner. Sub-resolution features 618 are placed adjacent a main feature, such as a metal layer of a MIM structure, and are sized such that they are not formed as part of the final product. However, sub-resolution features 618 have an effect on the etching process of the MIM layer. For example, as illustrated in FIG. 6G, metal layer 620 is formed having rounded corners that are larger than 0.1 μm. In some embodiments, the sub-resolution features 618 may be selected and/or placed using a rule-based methodology. In some embodiments, the shape of the sub-resolution features 618 (e.g., rectangular) may be a rule-based determination. In some embodiments, the size and/or location of the sub-resolution features 618 may be a model-based determination. In some embodiments, the shape of the sub-resolution features 618 may be a model-based determination.

Figure 7:
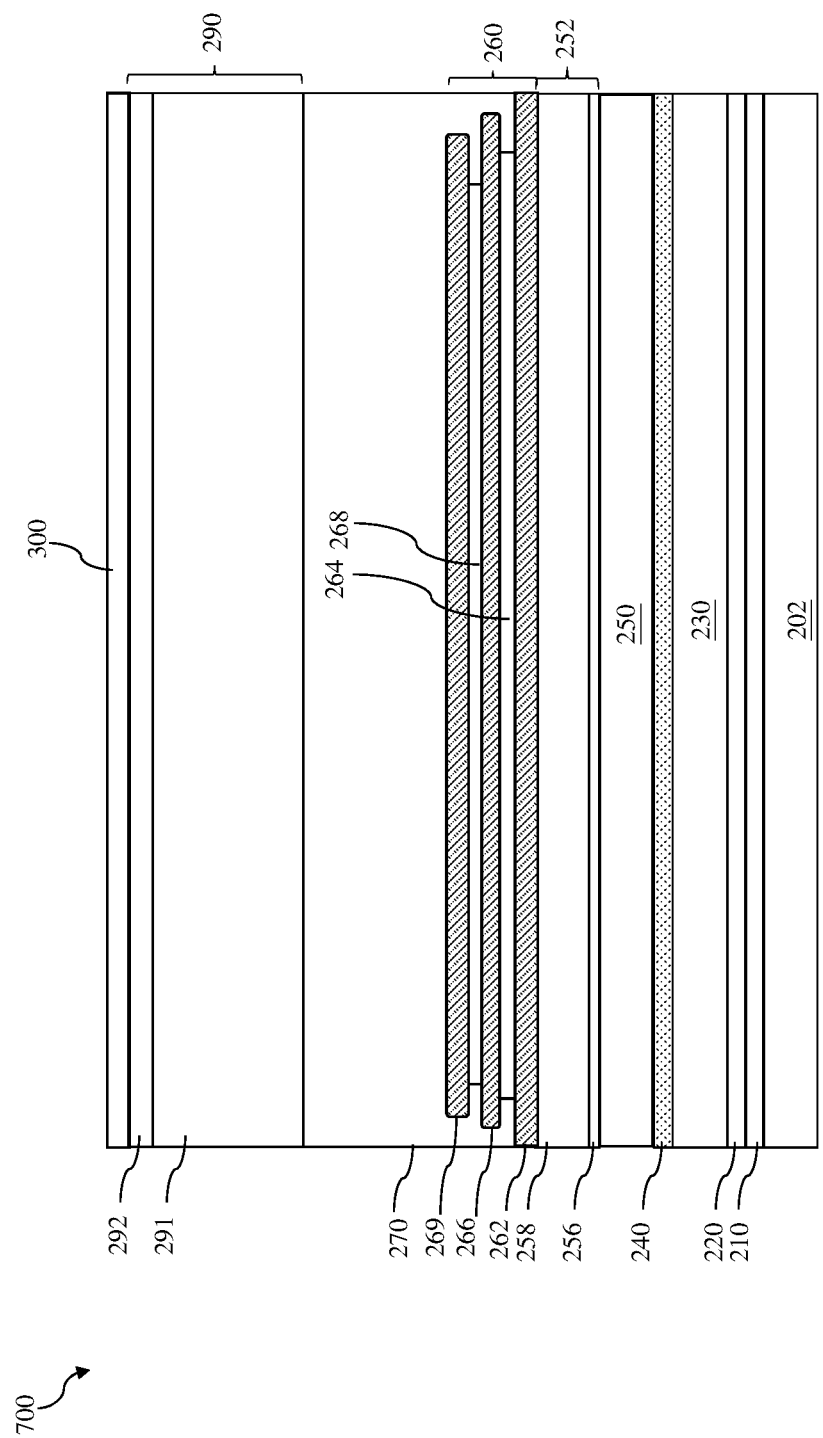
FIG. 7 is a diagrammatic cross-sectional view of a metal-insulator-metal device having an asymmetric structure (such as in accordance with the method of FIG. 1 and/or FIG. 5) according to various aspects of the present disclosure.

FIG. 7 is a diagrammatic cross-sectional view of a metal-insulator-metal (MIM) device 700 fabricated according to steps associated with method 100 of FIG. 1 using a photo mask fabricated according to steps associated with method 500 of FIG. 5 according to various aspects of the present disclosure. In some examples, MIM device 700 may be an example of MIM device 200. In some examples, FIG. 7 may illustrate a cross-section that is orthogonal to the cross-sectional views of illustrated in FIGS. 2A-2P. Similar to MIM device 200 described above, MIM device 700 may include a substrate 202, an interlayer dielectric (ILD) 210 formed over substrate 202, a carbide layer 220 formed over ILD 210, a dielectric layer 230 formed over carbide layer 220, a dielectric layer 240 formed over dielectric layer 230, a dielectric layer 250 formed over dielectric layer 240, and a first passivation layer 252 formed over dielectric layer 240. First passivation layer 252 may include a dielectric layer 258 formed over a dielectric layer 256. A MIM structure 260 may be formed over first passivation layer 252. MIM structure 260 may include a bottom plate layer 262, an insulator layer 264 formed over bottom plate layer 262, a middle plate layer 266 formed over insulator layer 264, an insulator layer 268 formed over middle plate layer 266, and a top plate layer 269 formed over insulator layer 269. A dielectric layer 270 may be formed over MIM structure 260. A second passivation layer 290 may be formed over dielectric layer 270. Second passivation layer 290 may include a dielectric layer 292 formed over a dielectric layer 291. A patterned polyimide (PI) layer 300 may be formed over the second passivation layer 290.

As depicted in FIG. 7, MIM structure 260 includes bottom plate layer 262 having a width greater than a width of middle plate layer 266 and the width of middle plate layer 266 being greater than a width of top metal plate layer 269. In some embodiments, the edges of bottom plate layer 262, middle plate layer 266, and top plate layer 269 may be rounded as described above with respect to FIGS. 3A-3D. Furthermore, insulator layer 264 and insulator layer 268 each have a width different than each other and different widths than each of plate layers 262, 266, 269. Dielectric layer 270 fills in space between bottom plate layer 262 and middle plate layer 266 and between middle plate layer 266 and top plate layer 269.

The asymmetric MIM structure 700 may be fabricated according the method 100 of FIG. 1 by etching each of plate layers 262, 266, 269 to have different widths. For example, bottom plate layer 262 may be larger than middle plate layer 266 by about 0.05 μm to about 500 μm on each side. Likewise, middle plate layer 266 may be larger than top plate layer 269 by about 0.05 μm to about 500 μm on each side. Furthermore, insulator layer 264 may be etched to be smaller on each side than middle plate layer 262 by about 0.05 µm to about 500 µm. Insulator layer 268 may be etched to be smaller on each side than top plate layer 269 by about 0.05 µm and about 500 µm. Forming MIM structure 700 as described may reduce stress accumulation at the edges and corners of MIM structure 700. Reducing stress accumulation at the edges and corners may also prevent further stress induced damage to MIM structure 700 such as, for example, delamination of the MIM plate layers in the MIM structure. Although FIG. 7 provides one depiction of an asymmetric MIM structure, this is exemplary for the sake of discussion and is not intended to limit the various configurations of the MIM structure 260. Other asymmetric MIM structure configurations may be formed according to various design parameters.

Figure 8:
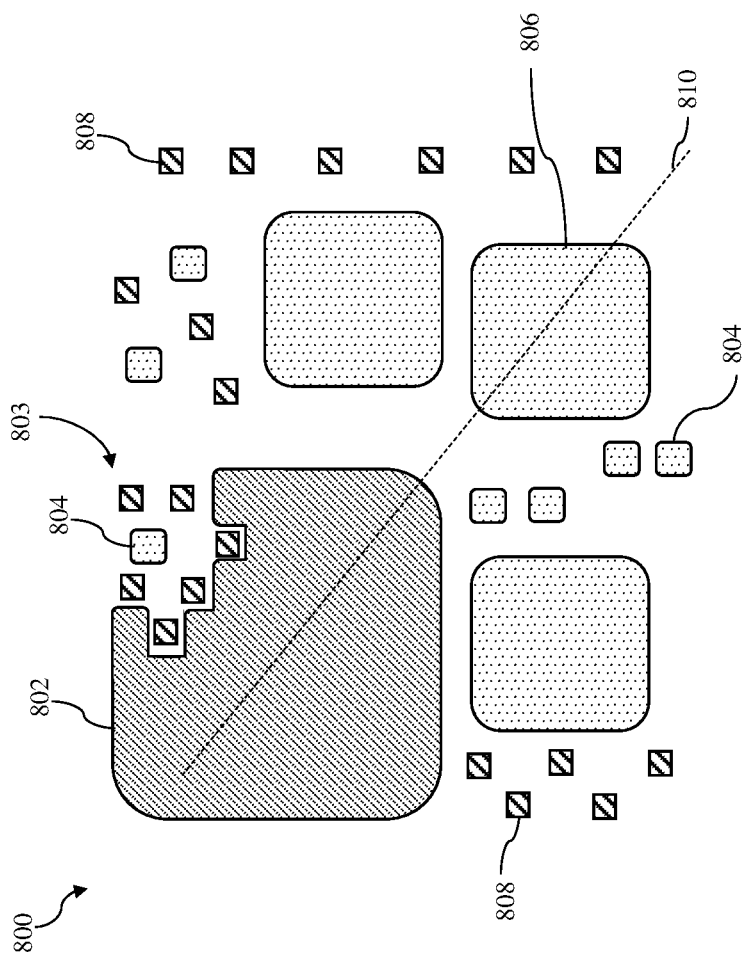
FIG. 8 is a top down view of an exemplary design layout including multiple metal-insulator-metal structures according to various aspects of the present disclosure.

FIG. 8 is a top down view of an exemplary device 800 including multiple metal-insulator-metal (MIM) structures according to various aspects of the present disclosure. Device 800 includes an active MIM structure 802 (e.g., similar to MIM structures described above), small dummy MIM structures 804, large dummy MIM structures 806, and vias 808. Active MIM structure 802 may include three metal layers as described above with respect to FIGS. 2A-2P and FIGS. 3A-3D. Although not illustrated, each of the metal layers of active MIM structure 802 may be shifted with respect to the other metal layers as described above with respect to FIGS. 3A-3D. Active MIM structure 802 is illustrated as being generally rectangular in shape, although other shapes are possible. For example, as illustrated active MIM structure 802 includes a portion 803 that is irregularly shaped. Portion 803 of active MIM structure 802 may be irregularly shaped (e.g., not rectangular, missing a corner, etc.) and may include multiple indented portions as illustrated in FIG. 8. Each indented portion may include rounded corners to improve the structural integrity (e.g., reduce accumulation of stress) of active MIM structure 802. The area exposed by removing portion 803 from active MIM structure 802 may be filled with vias 808 and/or small dummy MIM structures 804. In some embodiments, portion 803 may be designed as illustrated to allow vias to connect layers above active MIM structure 802 to layers below active MIM structure 802 without affecting the performance of active MIM structure 802.

Small dummy MIM structures 804 and large dummy MIM structures 806 may be placed around active MIM structure 802 to provide structural support within device 800. Large dummy MIM structures 806 may be about 40% to about 70% of the size of active MIM structure 802 and may include the same number of metal layers and dielectric layers as active MIM structure 802. Small dummy MIM structure 804 may be about 10% to about 40% of the size of large dummy MIM structure 806 and may include the same number of metal layers and dielectric layers as active MIM structure 802. In this way, both small dummy MIM structures 804 and large dummy MIM structure 806 may be the same height as active MIM structure 802 to provide structural support for device 800. Vias 808 may be formed in device 800 for additional structural support and/or electrical connections between layers above and below active MIM structure 802.

Space around active MIM structure 802 may be filled with these small dummy MIM structures 804, large dummy MIM structures 806, and/or vias 808. Different sized dummy MIM structures may be used to better fill the area around active MIM device 802. Placement of these structures may be determined based on the amount of empty space. In some embodiments, the structures may be used to fill about 50% to about 75% of the open space around active MIM structure 802. Placement of large dummy MIM structures 806 and small dummy MIM structures 804 may follow the process described above with respect to FIG. 5. For example, stress line 810 illustrates a line along which corner to corner stress of active MIM structure 802 and a large dummy MIM structure 806 may occur. The large dummy MIM structure 806 may be shifted laterally with respect to active MIM structure 802 to increase the distance between the two structures and reduce the accumulated stress of active MIM structure 802. Furthermore, the additional rounding of the corners of active MIM structure 802 and the large dummy MIM structure 806 as described herein may allow the large dummy MIM structure 806 to be placed closer to active MIM structure 802 than would otherwise be possible without the additional rounding of the corners of each structure.

The various embodiments described herein thus offer several advantages over the existing art. It will be understood that not all advantages have been necessarily discussed herein, no particular advantage is required for all embodiments, and other embodiments may offer different advantages. As one example, embodiments discussed herein include methods and structures for mitigating stress that would otherwise be induced on MIM capacitors and for preventing stress-induced damage to MIM capacitors. In some embodiments, one or more of the conductor plate layers in a MIM structure are formed having round corners. In some embodiments, one or more conductor plate layers in a MIM structure are processed to remove the square corners of the conductor plate layer after forming the conductor plate layer. In some embodiments, one or more conductor plate layers of a MIM structure have a chamfered corner. In some embodiments, the round corners of the conductor plate layers may function as a crack stop, preventing cracks within the passivation layer from propagating to the MIM structure, and thus preventing the formation of cracks and/or other defects within conductor plate layers or dielectric layers of the MIM structure. Additional benefits and/or other advantages will become apparent to those skilled in the art having benefit of the present disclosure.

The present disclosure provides for many different embodiments. An exemplary integrated circuit structure includes a rectangular-shaped metal-insulator-metal (MIM) structure having rounded corners. The rectangular-shaped MIM structure including a first metal layer, an insulator layer disposed over the first metal layer, and a second metal layer disposed over the insulator layer. In some embodiments, a second insulator layer may be disposed over the second metal layer and a third metal layer may be disposed over the second insulator layer. In some embodiments, the first metal layer may be disposed over a first lower contact and a second lower contact. A dielectric layer may be disposed over the MIM structure. In some embodiments, a first upper contact may extend through the dielectric layer, the first metal layer and the third metal layer to physically contact the first lower contact. In some embodiments, a second upper contact may extend through the dielectric layer and the second metal layer to physically contact the second lower contact. In some embodiments, an edge of the first metal layer may be chamfered or filleted.

Another exemplary device includes a first metal-insulator-metal (MIM) structure disposed over a substrate where the first MIM structure has a first rounded corner. The device further includes a second MIM structure disposed over the substrate and the second MIM structure has a second rounded corner. The device further includes a space between the first rounded corner of the first MIM structure and the second rounded corner of the second MIM structure that is filled by a dielectric material. The space provides a diagonal distance between the first rounded corner of the first MIM structure and the second rounded corner the second MIM structure.

An exemplary method includes forming a dielectric layer over a substrate and forming a rectangular-shaped metal-insulator-metal (MIM) structure having rounded corners over the dielectric layer. Forming the rectangular-shaped MIM structure having rounded corners includes forming a first conductor layer over the dielectric layer, forming an insulator layer over the first conductor layer, and forming a second conductor layer over the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first metal-insulator-metal (MIM) structure disposed over a substrate, wherein the first MIM structure includes:
a first metal layer;
a first insulator layer disposed over the first metal layer;
a second metal layer disposed over the first insulator layer, the first insulator layer preventing the second metal layer from interfacing with the first metal layer, the second metal layer being laterally offset from the first metal layer;
a second insulator layer disposed over the second metal layer; and
a third metal layer disposed over the second insulator layer, the second insulator layer preventing the third metal layer from interfacing with the second metal layer, wherein a corner of the third metal layer is rounded and the third metal layer is laterally offset from the second metal layer.

2. The device of claim 1, wherein the second metal layer is laterally offset from the first metal layer by a first distance, and
wherein the third metal layer is laterally offset from the second metal layer by a second distance that is different than the first distance.

3. The device of claim 1, wherein the third metal later metal layer is laterally offset from the first metal layer by a third distance that is different than the first distance and the second distance.

4. The device of claim 3, wherein the first distance is greater than the second distance, and
wherein the third distance is less than at least one of the first and second distances.

5. The device of claim 4, wherein the third distance is less than both the first and second distances.

6. The device of claim 1, further comprising a first contact feature extending through the second insulator layer, the second metal layer and the first insulator layer such that the first contact feature interfaces with the second metal layer and is electrically isolated from the first and third metal layers.

7. The device of claim 1, further comprising a first contact feature extending through the third metal layer, the second insulator layer, the first insulator layer and the first metal layer such that the first contact feature interfaces with the first and third metal layers and is electrically isolated from the second metal layer.

8. The device of claim 1, wherein at least one corner from each of the first and second metal layers is rounded.

9. A device comprising:
a first metal-insulator-metal (MIM) structure disposed on a substrate, wherein the first MIM structure includes:
a first conductive layer, the first conductive layer having a first rounded corner;
a first insulator layer disposed on and interfacing with the first conductive layer;
a second conductive layer disposed on and interfacing with the first insulator layer, the first insulator layer preventing the second metal layer from interfacing with the first conductive layer, the second conductive layer having a second rounded corner;
a second insulator layer disposed on and interfacing with the second conductive layer; and
a third conductive layer disposed on and interfacing with the second insulator layer, the second insulator layer preventing the third conductive layer from interfacing with the second conductive layer, the third conductive layer having a third rounded corner.

10. The device of claim 9, wherein all corners of the first conductive layer are rounded,
wherein all corners of the second conductive layer are rounded, and
wherein all corners of the third conductive layer are rounded.

11. The device of claim 9, wherein at least one of the first and second insulator layers includes a high-k dielectric material.

12. The device of claim 9, wherein at least one of the first and second insulator layers is a tri-layer structure including a first zirconium oxide layer, an aluminum oxide layer and a second zirconium oxide layer.

13. The device of claim 9, wherein a plurality of contact features extend through and interface with the second conductive layer, wherein the plurality of contact features are electrically isolated from the first and third conductive layers.

14. The device of claim 9, wherein a plurality of contact features extends through and interface with the first and third conductive layers, wherein the plurality of contact features are electrically isolated from the second conductive layer.

15. The device of claim 9, wherein the second conductive layer is laterally offset from the first conductive layer by a first distance,
wherein the third conductive layer is laterally offset from the second conductive layer by a second distance that is different than the first distance, and
wherein the third conductive layer is laterally offset from the first conductive layer by a third distance that is different than the first and second distances.

16. A method comprising:
forming a first metal-insulator-metal (MIM) structure on a substrate, wherein the forming of the first MIM structure includes:
forming a first conductor layer on the substrate, the first conductor layer having a first rounded corner;
forming a first insulator layer on the first conductor layer; and forming a second conductor layer on the first insulator layer, the second conductor layer having a second rounded corner; and forming a first contact feature through the first conductor layer such that the first contact feature is positioned closer to the substrate than the first conductor layer, wherein the first contact feature is electrically coupled to the first conductor layer while being electrically isolated from the second conductor layer.

17. The method of claim 16, further comprising forming a second contact feature through the second conductor layer such that the second contact feature is positioned closer to the substrate than the second conductor layer, wherein the second contact feature is electrically coupled to the second conductor layer while being electrically isolated from the first conductor layer.

18. The method of claim 16, further comprising:
forming a second insulator layer on the second conductor layer; and
forming a third conductor layer on the second insulator layer, the third conductor layer having a third rounded corner.

19. The method of claim 18, wherein the forming of the first contact feature through the first conductor layer includes forming the first contact feature through the third conductor layer such that the first contact feature is electrically coupled to the third conductor layer.

20. The method of claim 16, wherein the second conductor layer is laterally offset from the first conductor layer after the forming of the second conductor layer on the first insulator layer.

\* \* \* \* \*